(12) United States Patent
Lee

(10) Patent No.: US 7,616,145 B2
(45) Date of Patent: *Nov. 10, 2009

(54) REFERENCE CIRCUITS FOR SAMPLED-DATA CIRCUITS

(75) Inventor: Hae Seung Lee, Bedford, MA (US)

(73) Assignee: Cambridge Analog Technologies, Inc., Bedford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/178,044

(22) Filed: Jul. 23, 2008

(65) Prior Publication Data

US 2008/0278358 A1 Nov. 13, 2008

Related U.S. Application Data

(62) Division of application No. 11/617,228, filed on Dec. 28, 2006, now Pat. No. 7,522,086.

(60) Provisional application No. 60/754,683, filed on Dec. 29, 2005.

(51) Int. Cl.
 *H03M 1/12* (2006.01)
(52) U.S. Cl. .................. 341/155; 341/172; 341/150
(58) Field of Classification Search .............. 341/155, 341/171, 122, 150; 324/691
See application file for complete search history.

(56) References Cited

U.S. PATENT DOCUMENTS

| | | |
|---|---|---|
| 4,595,976 A | 6/1986 | Parro |
| 5,488,565 A | 1/1996 | Kennon et al. |
| 5,565,930 A | 10/1996 | Bolger et al. |
| 5,600,322 A | 2/1997 | Garavan |
| 5,869,999 A | 2/1999 | Mawet |
| 6,232,786 B1 | 5/2001 | Barnett |
| 6,249,240 B1 | 6/2001 | Bellaouar |
| 6,404,376 B1 | 6/2002 | Kalthoff et al. |
| 6,573,851 B2 | 6/2003 | Bult |
| 6,828,753 B2 | 12/2004 | Grasso et al. |
| 6,831,513 B2 * | 12/2004 | Matsumoto et al. ......... 330/253 |
| 6,891,433 B2 | 5/2005 | Schrader |
| 7,009,549 B1 | 3/2006 | Corsi |

FOREIGN PATENT DOCUMENTS

| | | |
|---|---|---|
| EP | 1221686 A2 | 7/2002 |
| GB | 211841 A | 8/1983 |
| GB | 2247120 A | 2/1992 |
| WO | 0013006 | 3/2000 |
| WO | 2004043062 | 5/2004 |
| WO | 2006047268 | 5/2006 |

* cited by examiner

*Primary Examiner*—Jean B Jeanglaude
(74) *Attorney, Agent, or Firm*—Gauthier & Connors LLP

(57) ABSTRACT

A switched capacitor circuit includes a first level-crossing detector to generate a level-crossing detection signal when an input signal crosses a first predetermined level. A first waveform generator generates a first predetermined waveform and a second waveform generator generates a second predetermined waveform. A second level-crossing detector generates a second level-crossing detection signal when said second predetermined waveform crosses a voltage reference level a second time. A second switch is coupled to the second level-crossing detector, and a third switch is coupled to the first level-crossing detector. The second switch turns OFF when the second level-crossing detection signal indicates the second predetermined waveform crossed the voltage reference level a second time. The third switch turns OFF when the first level-crossing detection signal indicates the input signal crossed the first predetermined level.

20 Claims, 26 Drawing Sheets

US 7,616,145 B2

REFERENCE CIRCUITS FOR SAMPLED-DATA CIRCUITS

PRIORITY INFORMATION

This application is a divisional application of U.S. Utility Application Ser. No. 11/617,228; filed Dec. 28, 2006, now U.S. Pat. No. 7,522,086, that claims priority from U.S. Provisional Application Ser. No. 60/754,683, filed on Dec. 29, 2005, both of which are incorporated herein by reference in their entireties.

FIELD OF THE PRESENT INVENTION

The present invention relates generally to reference circuits for sampled-data circuits.

BACKGROUND OF THE PRESENT INVENTION

Most sampled-data analog circuits such as switched-capacitor filters, analog-to-digital converters, and delta-sigma modulators require operational amplifiers to process the signal. Consider a switched-capacitor integrator example shown in FIG. 2. First, the switches $S_{11}$ and $S_{13}$ are closed so that the input voltage $v_{in}$ is sampled on the sampling capacitor $C_{S1}$. Next, the switches $S_{11}$ and $S_{13}$ are opened and $S_{12}$ and $S_{14}$ are closed. This operation transfers the charge in the sampling capacitor $C_{S1}$ to the integrating capacitor $C_{I1}$. The output voltage, $v_{out}$, of a first Integrator 1100 is typically sampled by another sampled-data circuit, for example, another switched-capacitor integrator. In the circuit shown in FIG. 2, the circuit consisting of switches $S_{21}$, $S_{22}$, $S_{23}$, $S_{24}$, and a second sampling capacitor $C_{S2}$ comprise a part of the second switched-capacitor integrator. The output voltage, $v_{out}$, of the first integrator 10 is sampled on the second sampling capacitor $C_{S2}$ by closing switches $S_{21}$ and $S_{23}$.

An example of a timing diagram is shown in FIG. 3. The clock signal has two non-overlapping phases $\phi_1$ and $\phi_2$. The phase $\phi_1$ is applied to switches $S_{11}$, $S_{13}$, $S_{21}$, and $S_{23}$, and phase $\phi_2$ is applied to switches $S_{12}$, $S_{14}$, $S_{22}$, and $S_{24}$. With this timing, the circuit performs non-inverting discrete integration with full clock delay. The waveforms at the output of the integrator, $v_{out}$, and at the virtual ground node 100, $v_1$, are also shown in FIG. 3. Different clock phasing arrangements yield different responses from the integrator. For example, if $\phi_1$ is applied to switches $S_{11}$, $S_{13}$, $S_{22}$, and $S_{24}$, and phase $\phi_1$ is applied to switches $S_{12}$, $S_{14}$, $S_{21}$, and $S_{23}$, the circuit performs non-inverting integration with half-clock delay.

For an accurate integration of the input signal, $v_1$ must be driven as close to ground as possible. In order to accomplish this, the operational amplifier must provide sufficient open-loop gain and low noise. In addition, for fast operation, the operational amplifier 10 of FIG. 2 must settle fast.

In FIG. 3, the voltage $v_1$ is shown to settle back to ground after a disturbance when the sampling capacitor $C_{S1}$ is switched to Node 100 by closing $S_{12}$ and $S_{14}$. In addition to high open-loop gain and fast settling time, operational amplifiers must provide large output swing for high dynamic range. As the technology scales, it becomes increasingly difficult to achieve these characteristics from operational amplifiers. The primary factors that make the operational amplifier design difficult are low power supply voltages and low device gain.

As noted above, accurate output voltage can be obtained if Node 100 in FIG. 2 is maintained precisely at ground. However, in sampled-data circuits, the only point of time accurate output voltage is required is at the instant the output voltage is sampled by another sampling circuit. Thus, it is not necessary to maintain the voltage at Node 100 at ground all the time.

Zero-crossing detectors can be applied in other switched-capacitor circuits such as algorithmic and pipeline analog-to-digital converters, delta-sigma converters, and amplifiers. These applications often require constant voltage sources, referred to as reference voltages.

Therefore, it is desirable to provide zero-crossing detectors in algorithmic analog-to-digital converters, pipeline analog-to-digital converters, delta-sigma converters, and amplifiers which apply voltage sources, such as reference voltages, in zero-crossing detector based circuits in a manner that reduces the power consumption required in such voltage sources without degrading noise performance or speed of zero-crossing based circuits.

SUMMARY OF THE PRESENT INVENTION

One aspect of the present invention is an analog-to-digital converter. The analog-to-digital converter includes a level-crossing detector to generate a level-crossing detection signal when an input signal crosses a predetermined level; a waveform generator to generate a predetermined waveform; a first switched capacitance circuit; a switched capacitance circuit; a sampling switch, operatively coupled to the level-crossing detector; and a voltage reference circuit operatively coupled to the switched capacitance circuit. The sampling switch turns OFF when the level-crossing detection signal indicates the input signal crossed the predetermined level.

Another aspect of the present invention is a switched capacitor circuit. The switched capacitor circuit includes a level-crossing detector to generate a level-crossing detection signal when an input signal crosses a voltage reference level; a waveform generator to generate a predetermined waveform; a switched capacitance circuit operatively connected to the level-crossing detector; a switch operatively coupled to the first level-crossing detector; and a voltage reference circuit operatively coupled to the switched capacitance circuit to provide a voltage reference level. The switch turns OFF when the level-crossing detection signal indicates the input signal crossed the voltage reference level.

Another aspect of the present invention is a switched capacitor circuit. The switched capacitor circuit includes a first waveform generator to generate a first predetermined waveform; a first level-crossing detector to generate a first level-crossing detection signal when an input signal crosses a first voltage reference level; a first switch operatively coupled to the first level-crossing detector; a first sampling capacitor operatively connected to the first level-crossing detector; a second waveform generator to generate a second predetermined waveform; a second level-crossing detector to generate a second level-crossing detection signal when a second input signal crosses a second voltage reference level; a second switch operatively coupled to the second level-crossing detector; a second sampling capacitor operatively connected to the first level-crossing detector; and a third level-crossing detector differentially coupled to the first and second sampling capacitors. The first switch turns OFF when the first level-crossing detection signal indicates the input signal crossed the first voltage reference level. The second switch turns OFF when the second level-crossing detection signal indicates the second input signal crossed the second voltage reference level.

Another aspect of the present invention is a switched capacitor circuit. The switched capacitor circuit includes a level-crossing detector to generate a level-crossing detection signal when an input signal crosses a first predetermined level; a waveform generator to generate a first predetermined waveform; a switched capacitance circuit operatively connected to the level-crossing detector; a voltage reference circuit operatively coupled to the switched capacitance circuit to provide a voltage reference level; a switch operatively coupled to the level-crossing detector; and a sampling capacitor operatively connected to the level-crossing detector. The switch turns OFF when the level-crossing detection signal indicates the input signal crossed the first predetermined level.

Another aspect of the present invention is a reference voltage source. The reference voltage source includes a level-crossing detector to generate a level-crossing detection signal when an input signal crosses a predetermined level; a waveform generator to generate a first predetermined waveform; a switch operatively coupled to the level-crossing detector; a sampling capacitor operatively connected to the level-crossing detector; a first bias voltage source operatively connected to an input terminal of the level-crossing detector; and a second bias voltage source operatively connected to the input terminal of the level-crossing detector. The switch turns OFF when the level-crossing detection signal indicates the input signal crossed the predetermined level.

Another aspect of the present invention is a reference voltage source. The reference voltage source includes a waveform generator to generate a predetermined waveform; a first transistor operatively connected to the waveform generator; a second transistor operatively connected to the waveform generator; a level-crossing detector to generate a level-crossing detection signal when an input signal crosses a predetermined level; a switch operatively coupled to the level-crossing detector; and a sampling capacitor operatively connected to the level-crossing detector. The switch turns OFF when the level-crossing detection signal indicates the input signal crossed the predetermined level.

Another aspect of the present invention is a reference voltage source. The reference voltage source includes a waveform generator to generate a predetermined waveform; an amplifier operatively connected to the waveform generator; a first bias voltage source operatively connected to the amplifier; a second bias voltage source operatively connected to the amplifier; and a level-crossing detector to generate a level-crossing detection signal when an input signal crosses a predetermined level. The waveform generator turns OFF when the level-crossing detection signal indicates the input signal crossed a predetermined level.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
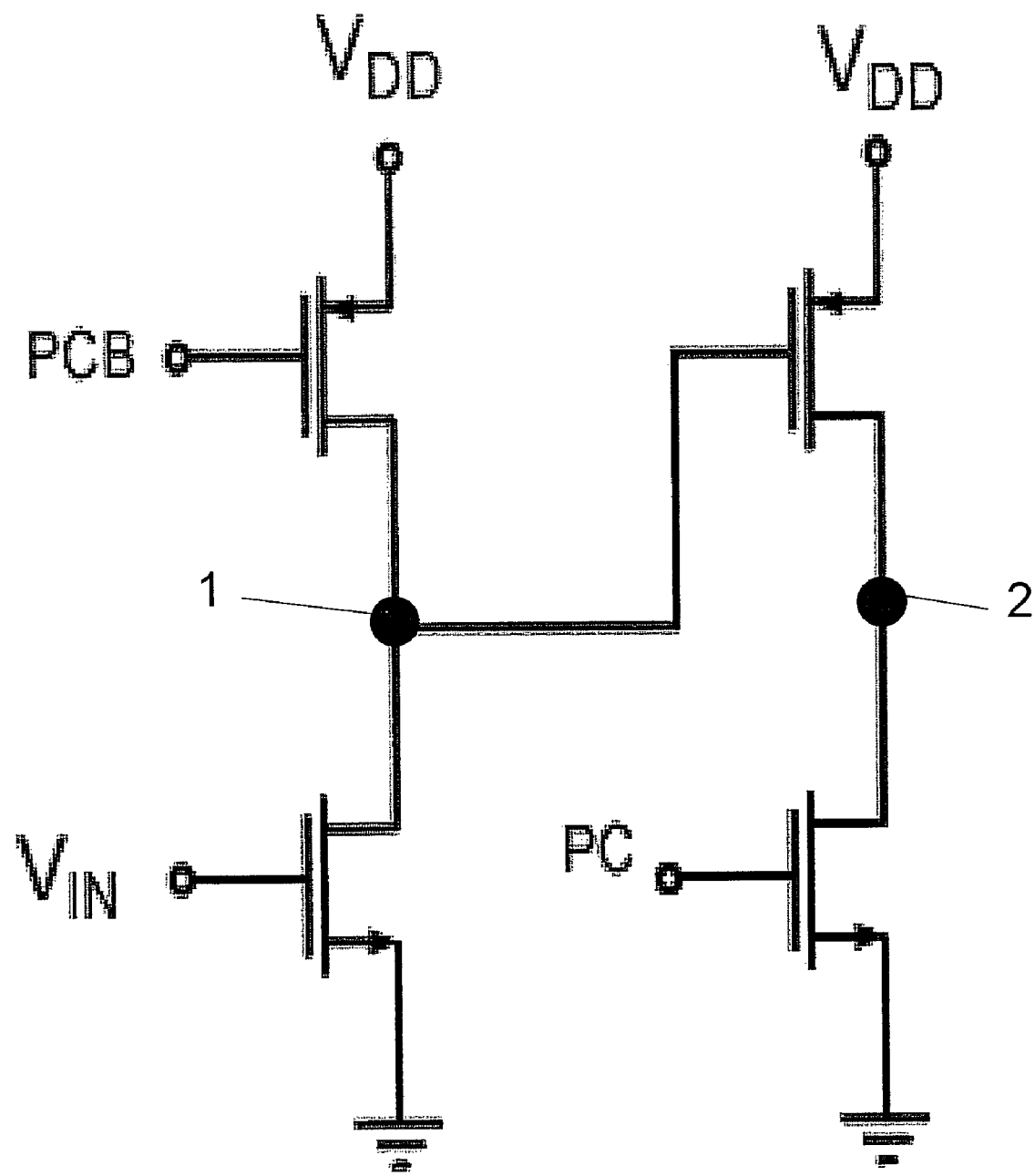
FIG. 1 illustrates a zero-crossing detector.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

It is noted that, in the various Figures, the earth symbol indicates the system's common-mode voltage. For example, in a system with 2.5 V and −2.5 V power supplies, the system's common-mode voltage may be at ground. In a system with a single 2.5 power supply, the system's common-mode voltage may be at 1.25 V.

Figure 2:
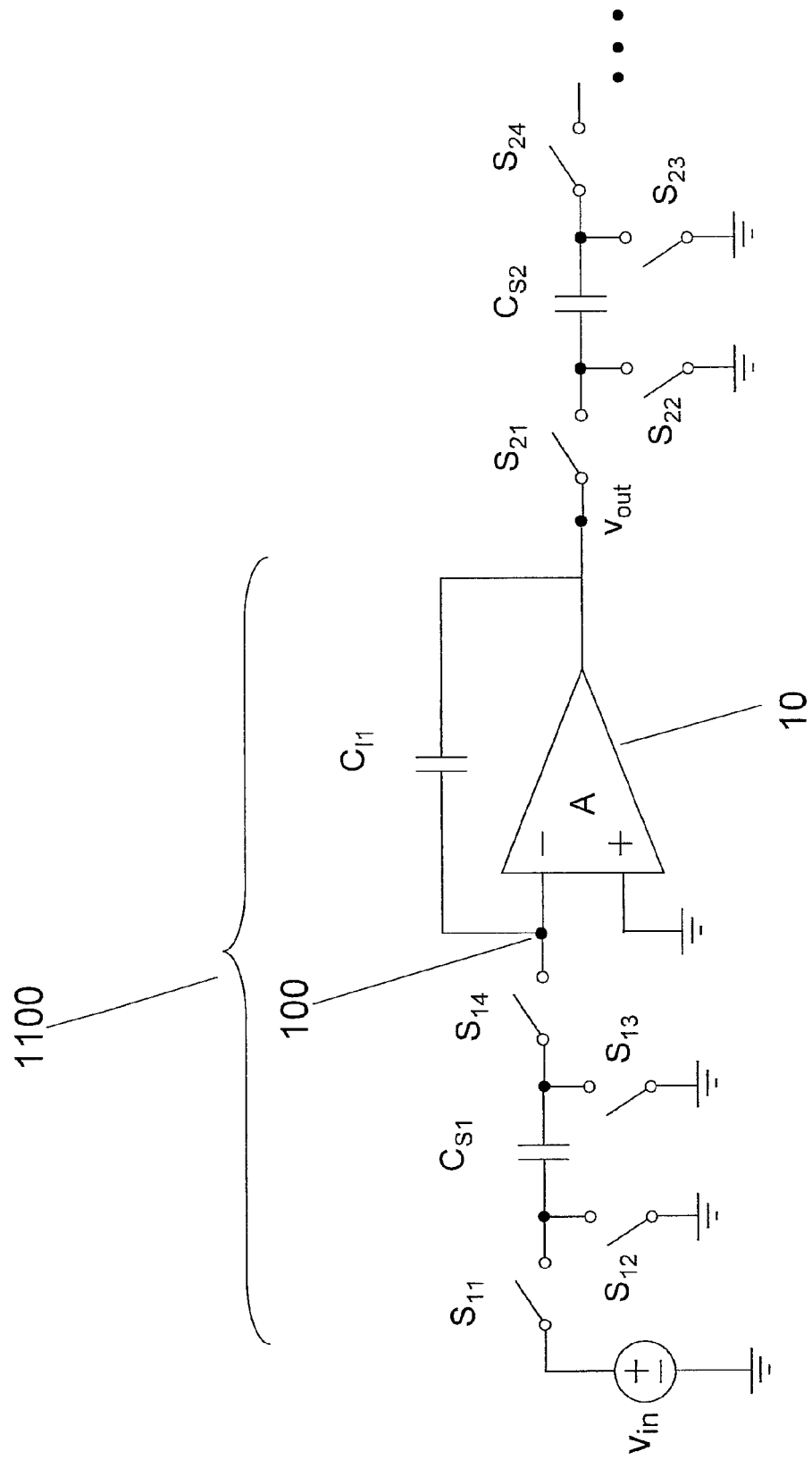
FIG. 2 illustrates a switched-capacitor integrator.
Figure 3:
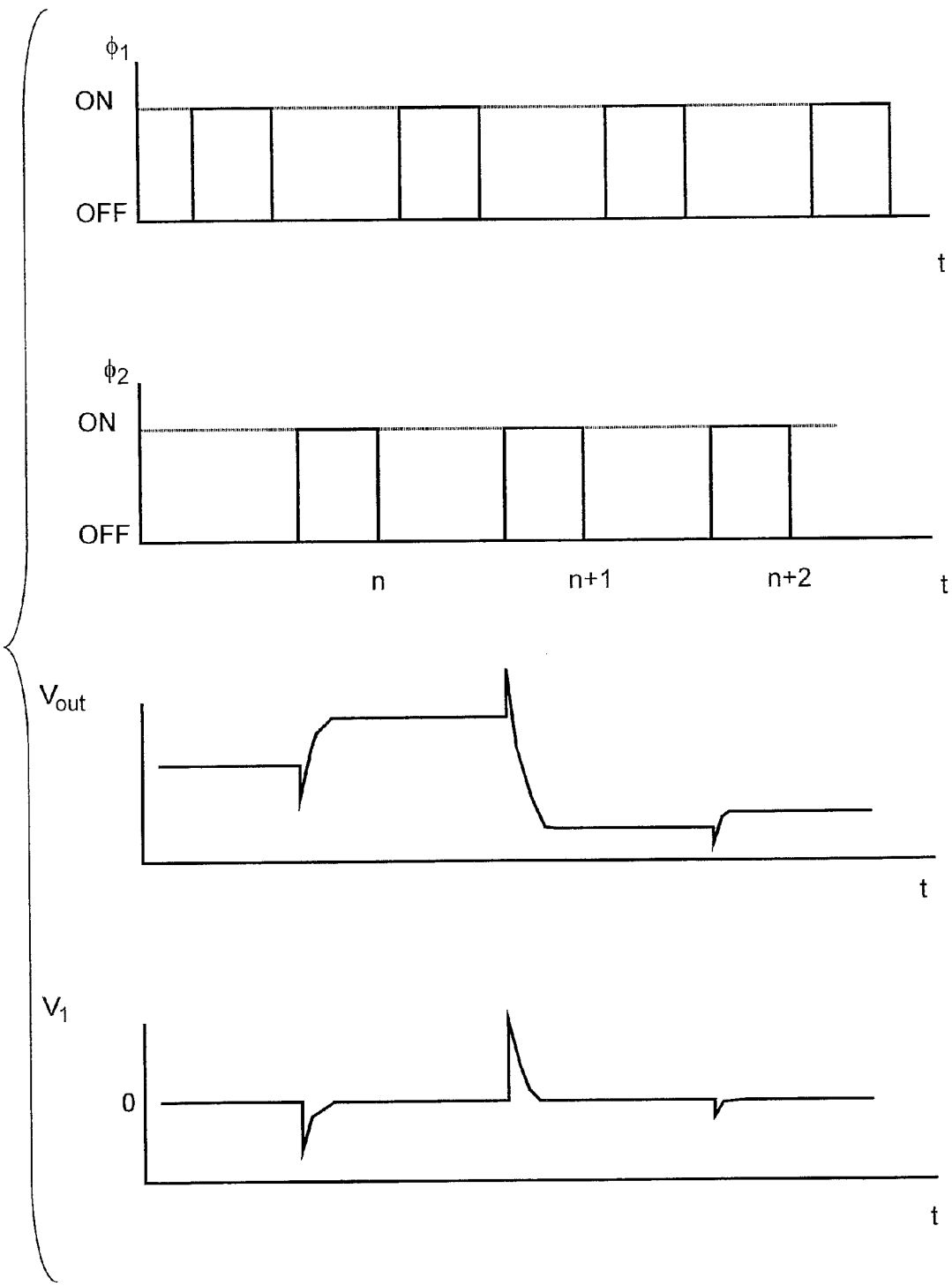
FIG. 3 illustrates a timing diagram for the switched-capacitor integrator of FIG. 2.

As noted above, accurate output voltage can be obtained if Node 100 in FIG. 2 is maintained precisely at ground. However, in sampled-data circuits, the only point of time accurate output voltage is required is at the instant the output voltage is sampled by another sampling circuit. Thus, it is not necessary to maintain the voltage at Node 100 at ground all the time.

Figure 4:
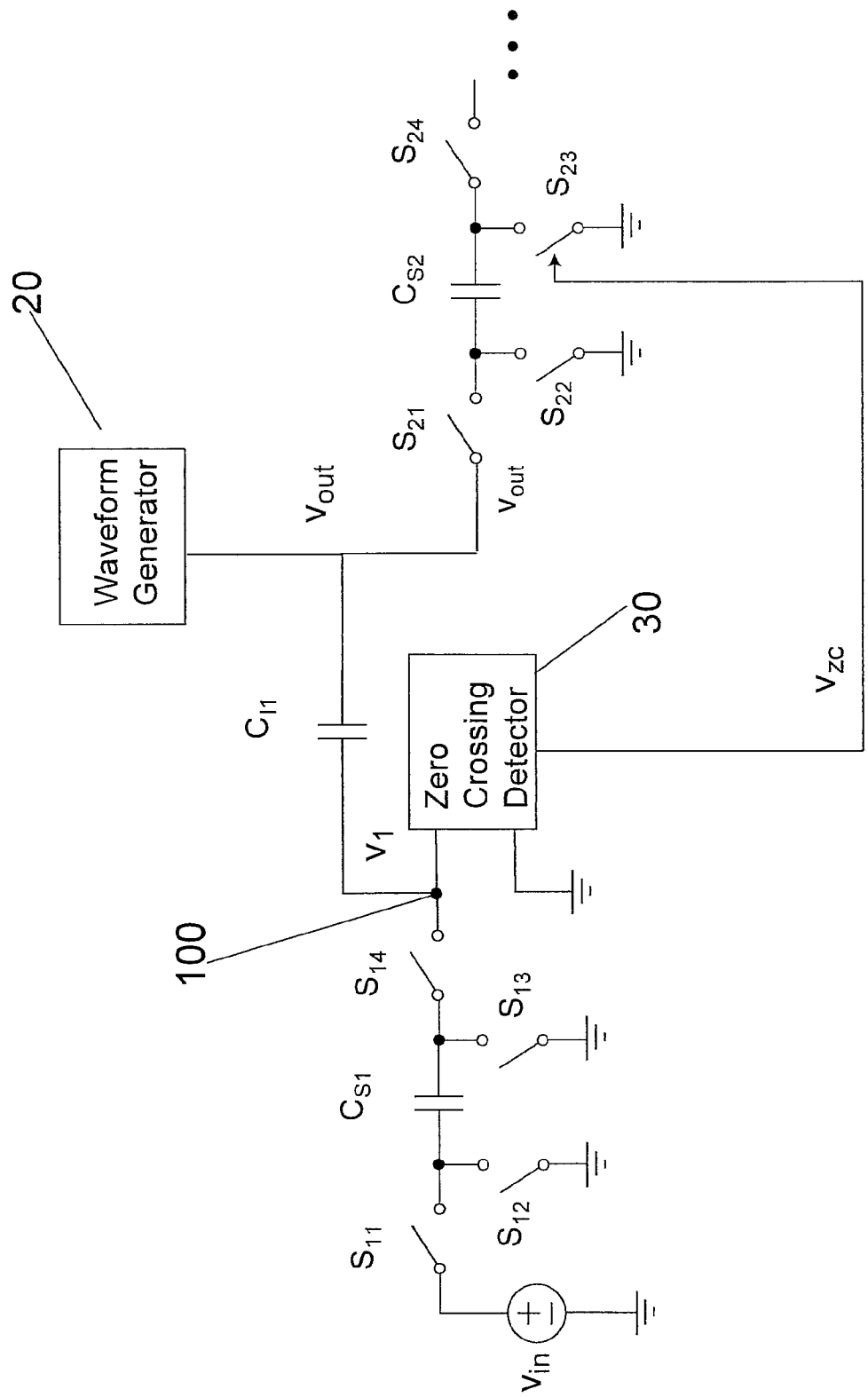
FIG. 4 illustrates a non-inverting integrator according to the concepts of the present invention.

FIG. 4 illustrates a non-inverting integrator according to the concepts of the present invention. More specifically, as an example, a non-inverting integrator with half-clock delay is illustrated in FIG. 4.

As illustrated in FIG. 4, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$. A waveform generator 20 generates a voltage waveform as the output voltage $v_{out}$ in such way the voltage at Node 100 crosses zero if the charge in capacitors $C_{S1}$ and $C_{I1}$ is within a normal operating range.

Figure 5:
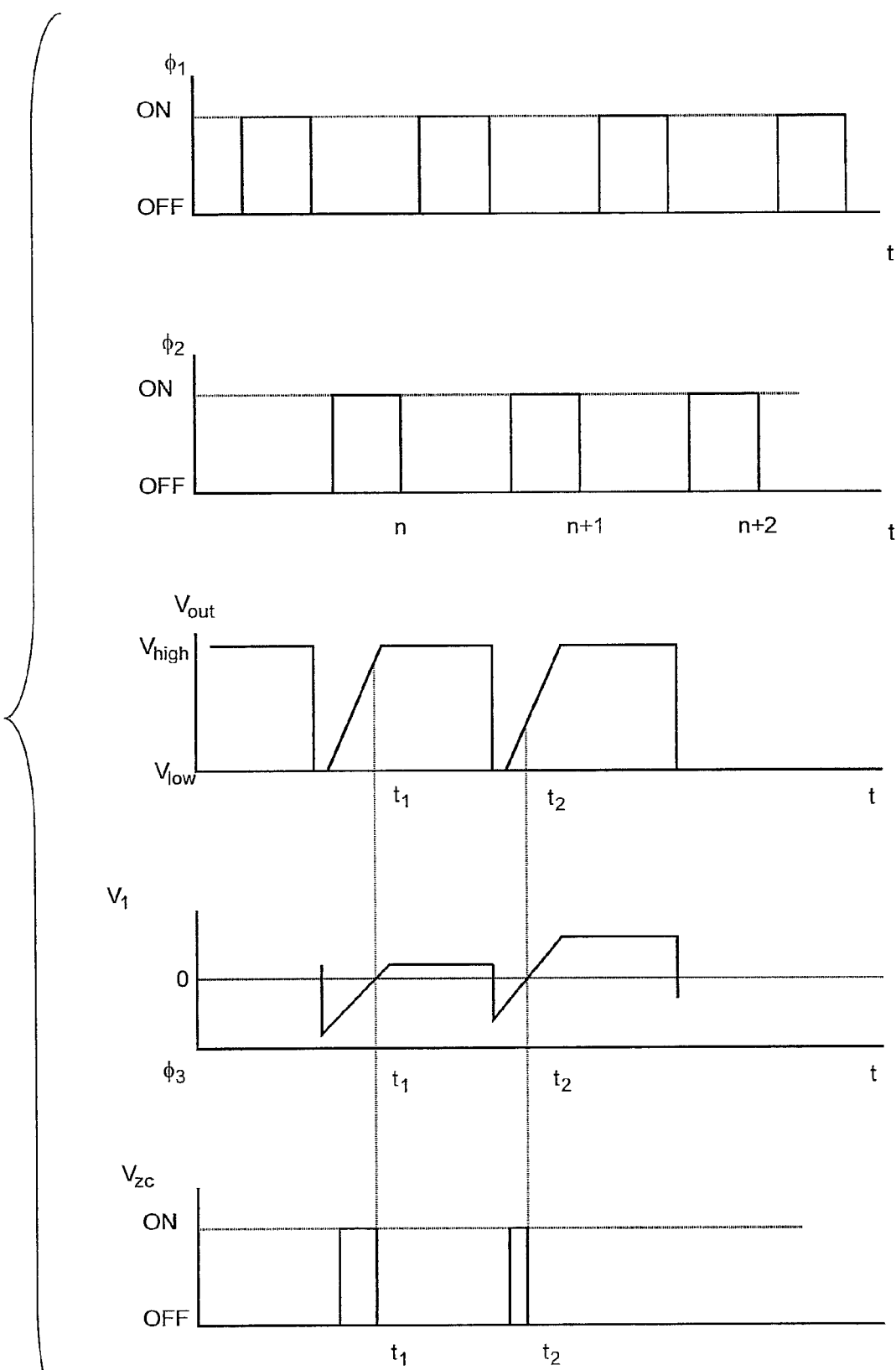
FIG. 5 illustrates a timing diagram for the non-inverting integrator of FIG. 4.

In the timing diagram shown in FIG. 5, the waveform generated by the waveform generator 20 is shown as a ramp. When $v_1$, the voltage at Node 100, crosses zero at time $t_1$, the output $v_{zc}$ of the zero crossing detector 30 goes low, turning the switch $S_{23}$ OFF. At that instant, the output voltage $v_{out}$ is sampled on $C_{S2}$.

Since $v_1$ is very close to zero when the sample of $v_2$ is taken, an accurate output voltage is sampled on $C_{S2}$. A similar operation repeats during the next clock cycle, and the sample of the output voltage is taken at time $t_2$.

It is noted that the zero crossing detector 30 may optionally have an overflow detection feature that determines when the charge in capacitors $C_{S1}$ and $C_{I1}$ is outside the normal range of operation. It can be implemented by a logic circuit that makes the output $v_{zc}$ of the zero-crossing detector 30 to go low when $\phi_2$ goes low. In the event $v_1$ fails to cross zero, the sample is taken on the falling edge of $\phi_2$. At the same time, the logic circuit produces a flag indicating overflow.

In the embodiment described above and in the various embodiments described below, a zero crossing detector is utilized in lieu of a comparator. Typically, a comparator is designed to compare two arbitrary input voltages. A comparator may be implemented as cascaded amplifiers, a regenerative latch, or a combination of both. A comparator may be used to detect a zero voltage level or a predetermined voltage level crossing.

It is noted that the input waveform of the various described embodiments is not arbitrary, but deterministic and repetitive. Thus, the various described embodiments determine the instant the zero voltage level or the predetermined voltage level is crossed than relative amplitudes of the input signals. For such a deterministic input, a zero crossing detector is more efficient.

An example of a zero-crossing detector for the detection of a positive-going input signal is shown in FIG. 1. Initially, node 1 and node 2 are precharged to $V_{DD}$ and ground, respectively. The ramp input voltage $V_{IN}$ is applied according to the zero crossing circuit. At the time the input node crosses the threshold, node 1 is discharged rapidly, and node 2 is pulled up to $V_{DD}$. Since the zero crossing detector in FIG. 1 is a dynamic circuit, there is no DC power consumption, allowing extremely low power and fast operation. For the detection of zero-crossing of a negative-going signal, a complementary circuit with a PMOS input transistor can be utilized.

Figure 6:
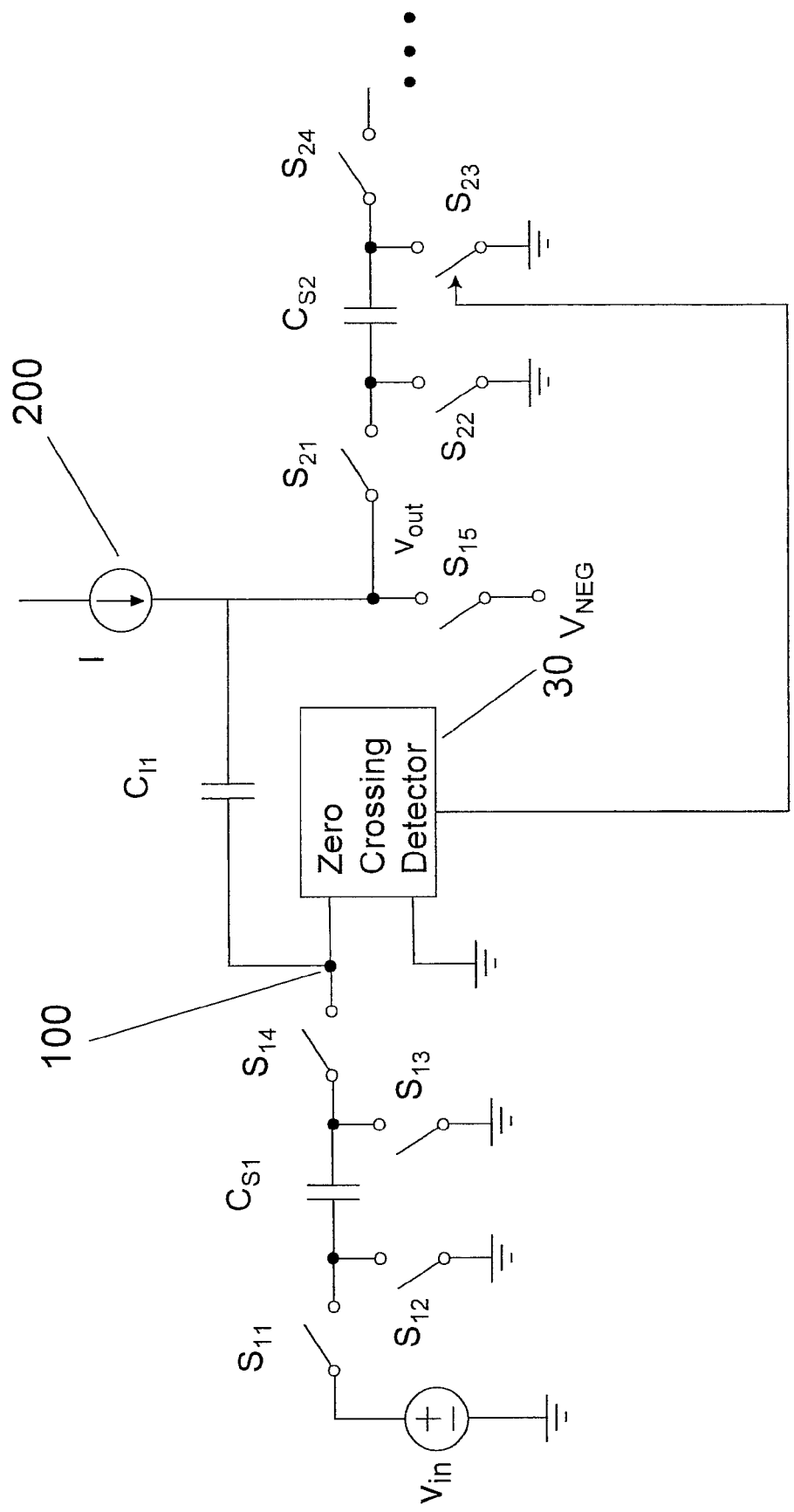
FIG. 6 illustrates a non-inverting integrator with a waveform generator being a current source according to the concepts of the present invention.

As illustrated in FIG. 6, the non-inverting integrator includes a waveform generator which is a current source 200. As illustrated in FIG. 6, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

The current source 200 charges the capacitors $C_{S2}$ and the series connected $C_{S1}$ and $C_{I1}$, generating a ramp. At the start of $\phi_2$, the output is briefly shorted to a known voltage $V_{NEG}$, the value of which is chosen to ensure the voltage $v_1$ at Node 100 crosses zero with signals in the normal operating range.

Figure 7:
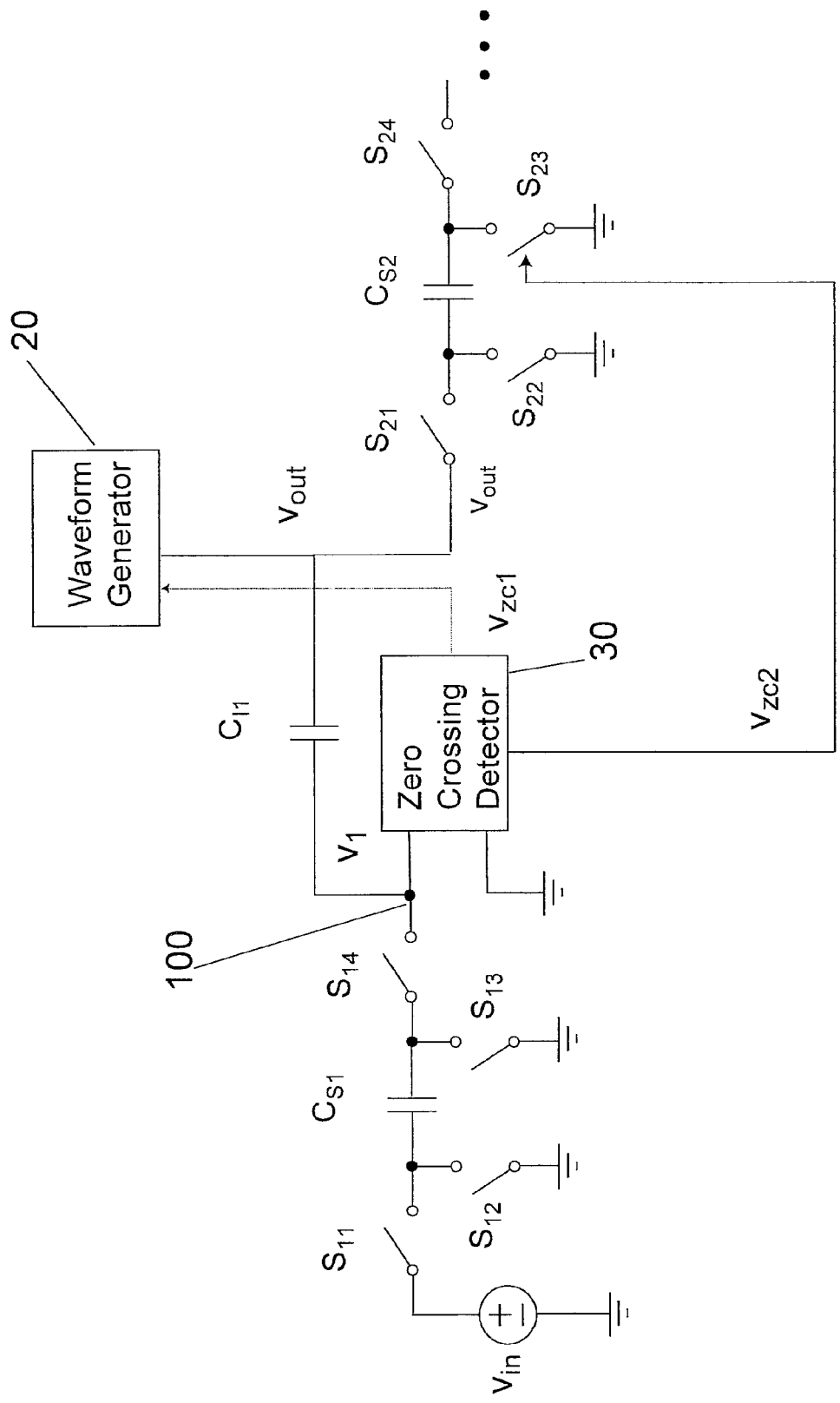
FIG. 7 illustrates another non-inverting integrator according to the concepts of the present invention.

As illustrated in FIG. 7, the non-inverting integrator includes a waveform generator 20 that produces, preferably, a plurality of segments in the waveform with varying rate of change of the output voltage. The first segment may be controlled so as to have the highest rate of change, with subsequent segments having progressively lower rate of change. The detection of zero crossing by the zero crossing detector 30 causes the waveform to advance to the next segment. An output signal $v_{zc2}$ of the zero crossing detector 30 remains high until the zero crossing is detected in the last segment of the waveform.

Figure 8:
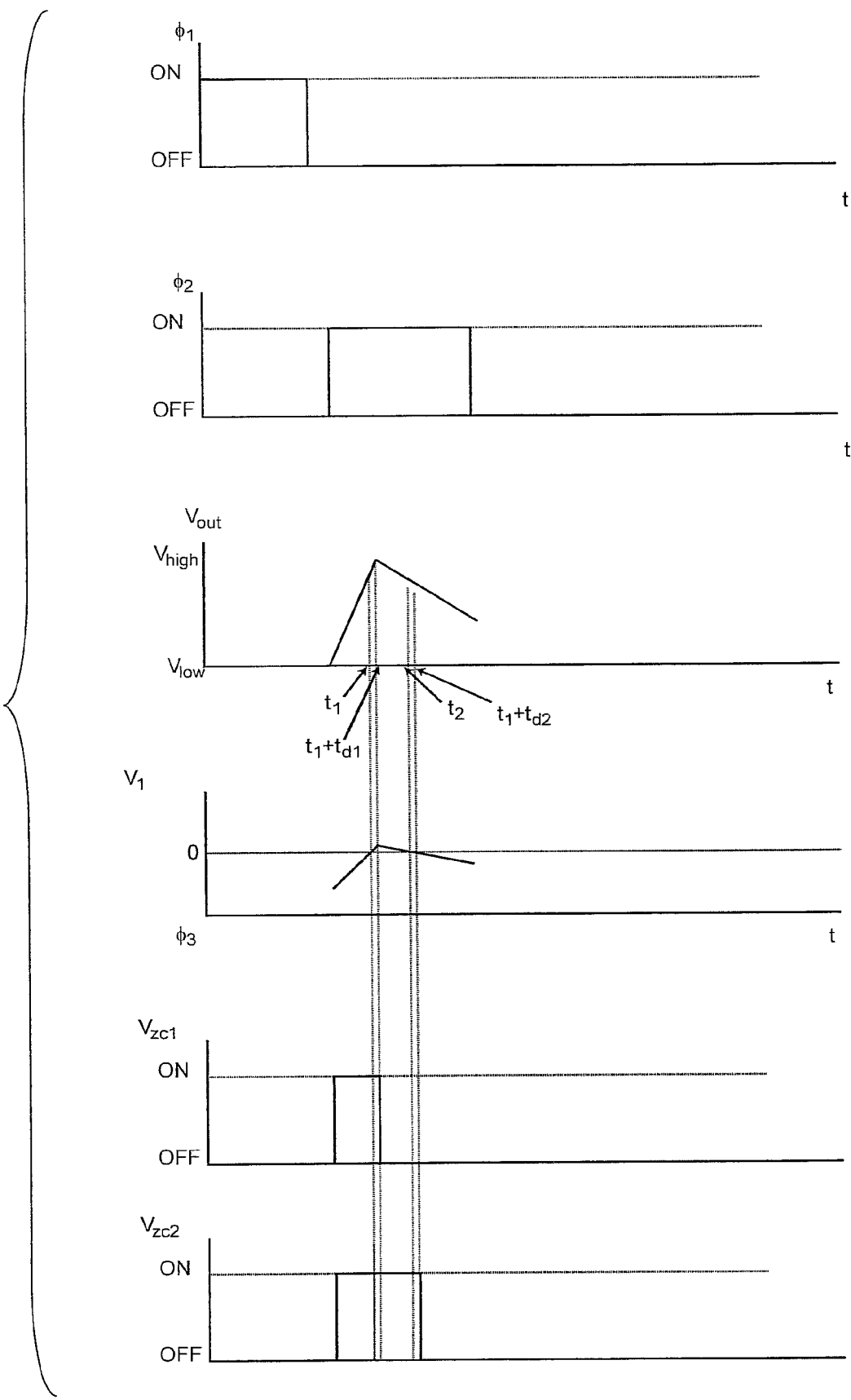
FIG. 8 illustrates a timing diagram for the non-inverting integrator of FIG. 7.

One clock cycle of the timing diagram is shown in FIG. 8. At the start of $\phi_2$, the waveform generator 20 produces an up ramp. The voltage $v_1$ is shown to cross zero at time $t_1$. One output, $v_{zc1}$, of the zero crossing detector 30 changes its state after a finite delay $t_{d1}$.

The delay $t_{d1}$ represents finite delay of a typical zero crossing detector 30. This change of state advances the waveform to the next segment.

Due to the $t_{d1}$ of the zero crossing detector 30, the voltage $v_1$ overshoots by a small amount above ground. The second segment of the waveform generator is a down ramp to permit another zero crossing at time $t_2$. After a second delay $t_{d2}$, the output $v_{zc2}$ of the zero crossing detector 30 goes low, causing the switch $S_{23}$ to turn OFF, locking the sample of the output voltage $v_{out}$.

The delay $t_{d2}$ of the second zero crossing is not necessarily the same as the delay associated with the first zero crossing $t_{d1}$. The delay $t_{d2}$ contributes a small overshoot to the sampled output voltage. The effect of the overshoot can be shown to be constant offset in the sampled charge. In most sampled-data circuits, such constant offset is of little issue.

The zero crossing detector 30 preferably becomes more accurate in detecting the zero crossing as the segments of the waveform advances. The first detection being a coarse detection, it does not have to be very accurate. Therefore, the detection can be made faster with less accuracy. The last zero crossing detection in a given cycle determines the accuracy of the output voltage. For this reason, the last zero crossing detection must be the most accurate.

The accuracy, speed, and the power consumption can be appropriately traded among progressive zero crossing detections for the optimum overall performance. For example, the first detection is made less accurately and noisier but is made faster (shorter delay) and lower power. The last detection is made more accurately and quieter while consuming more power or being slower (longer delay).

Figure 9:
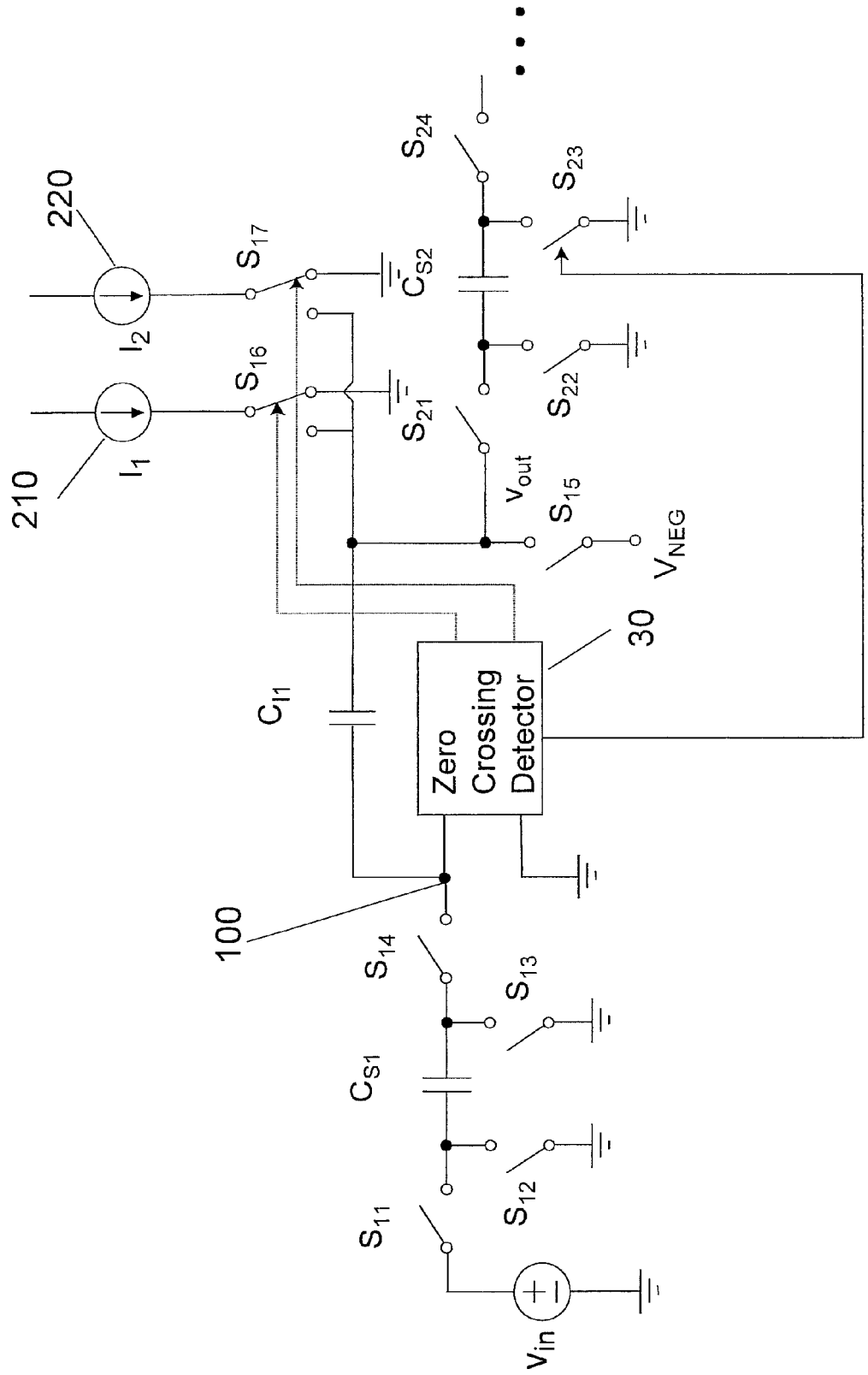
FIG. 9 illustrates another non-inverting integrator according to the concepts of the present invention.

An example of a two-segment waveform generator constructed of two current sources (210 and 220) is shown in FIG. 9. As illustrated in FIG. 9, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

Current sources 210 and 220 charge the capacitors $C_{S2}$ and the series connected $C_{S1}$ and $C_{I1}$ generating two segments of a ramp waveform. At the start of $\phi_2$, the output is briefly shorted to a known voltage $V_{NEG}$, the value of which is chosen to ensure the voltage $v_1$ crosses zero with signals in the normal operating range. During the first segment, the current source 210 is directed to the output, while during the second segment, the current source 220 is directed to the output, generating two different slopes of ramp.

Figure 10:
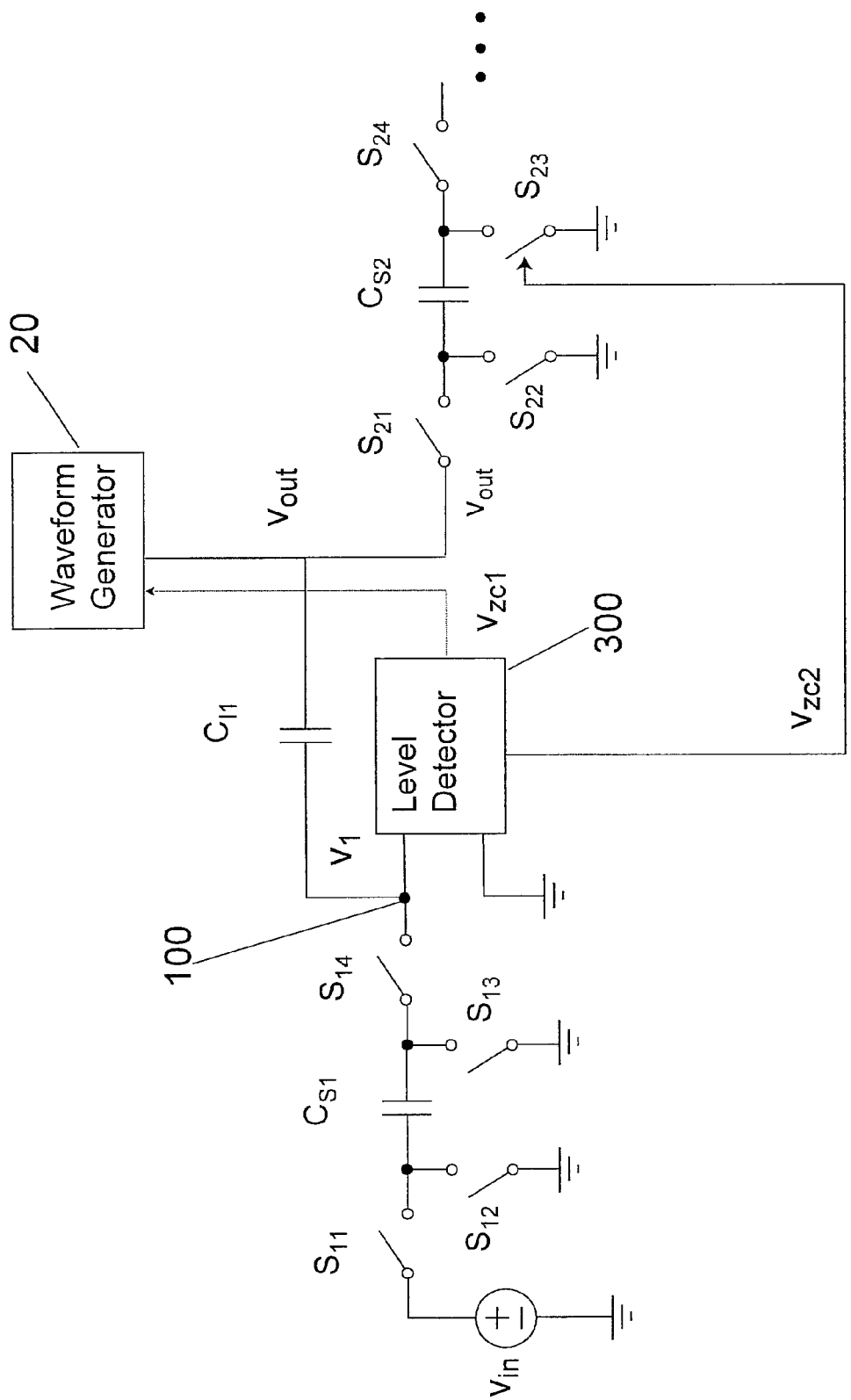
FIG. 10 illustrates another non-inverting integrator according to the concepts of the present invention.

As illustrated in FIG. 10, the non-inverting integrator includes a level crossing detector 300 having plurality of thresholds. As illustrated in FIG. 10, a clock phase $\phi_1$ is applied to switches $S_{11}$, $S13$, $S_{22}$, and $S_{24}$, and another phase $\phi_2$ is applied to switches $S_{12}$, $S_{14}$, and $S_{21}$. A level crossing detector 300 is used to detect the point of time at which Node 100 crosses one of plurality of predetermined levels as discussed below. The switch $S_{23}$ is controlled by the output of the level crossing detector 300. The output of the level crossing detector 300 is used to determine the time point to take the sample of the output voltage $v_{out}$.

The thresholds are predetermined voltage levels. The thresholds of the level crossing detector 300 can be adjusted to minimize overshoot.

Figure 11:
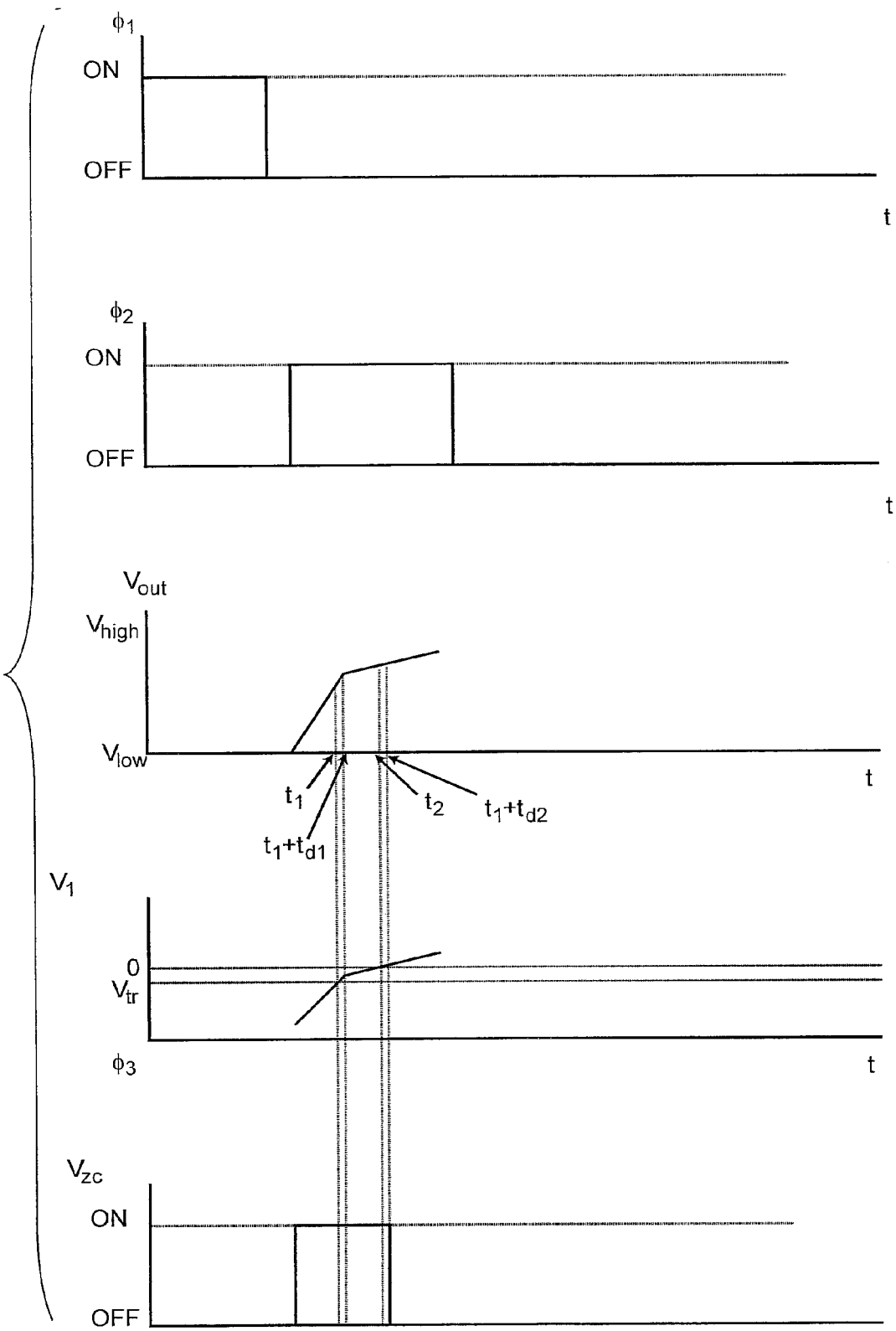
FIG. 11 illustrates a timing diagram for the non-inverting integrator of FIG. 10.

For example, the threshold for the first detection may be made negative by a slightly smaller amount than the expected overshoot in the first segment. This minimizes the ramp-down time in the second segment. Also, the threshold for the second segment may be made more positive by the amount of the overshoot in the second segment in order to cancel the effect of the overshoot. Alternatively, the threshold for the first segment may be made more negative than the expected overshoot during the first segment. This permits the second segment to be a positive ramp rather than a negative ramp as shown in FIG. 11.

It is advantageous to make the detection during the last segment to be the most accurate detection. The accuracy of the detection during the last segment is made higher than during other segments. This can be achieved by making the delay longer or making the power consumption higher during the last segment.

Figure 12:
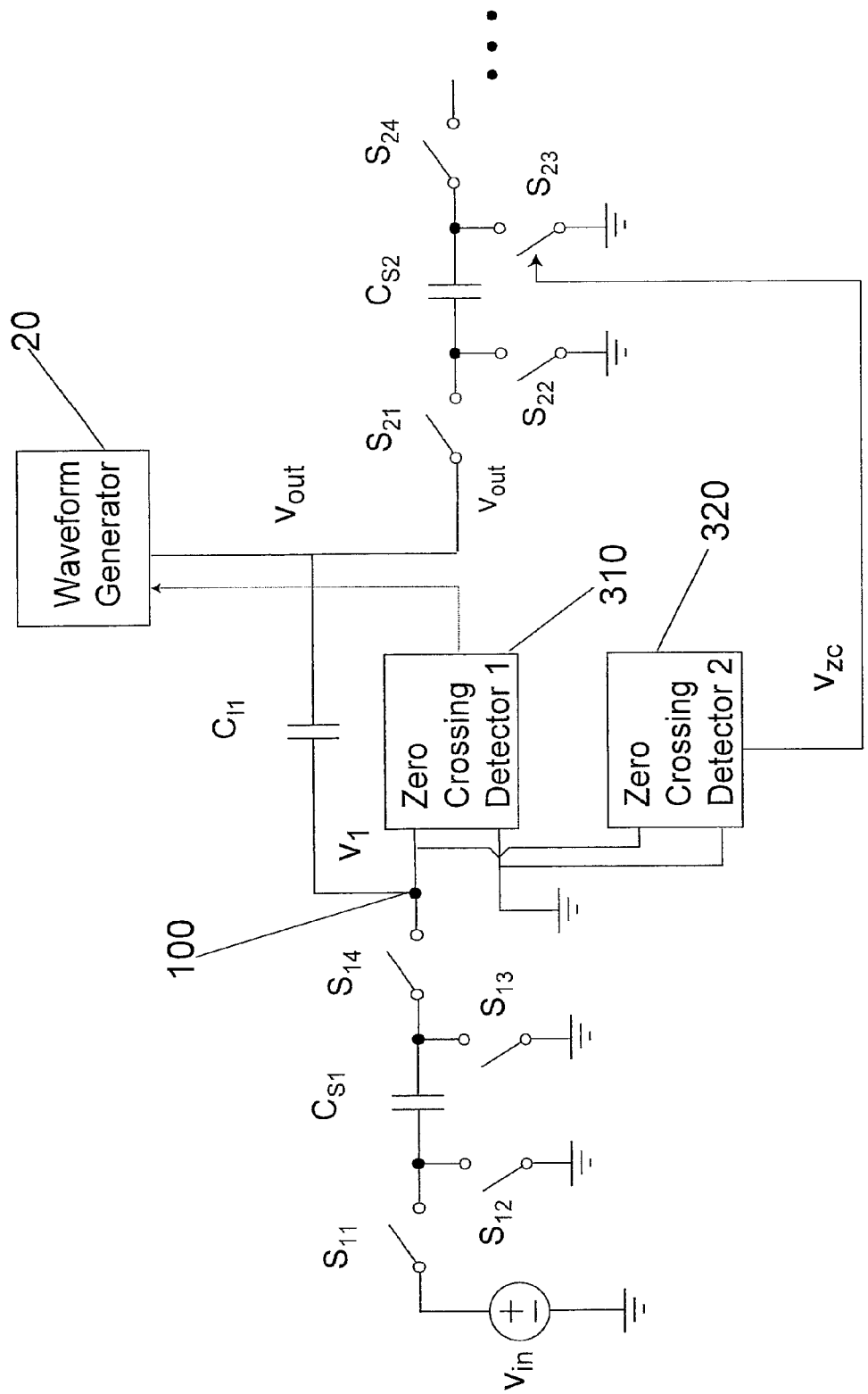
FIG. 12 illustrates another non-inverting integrator according to the concepts of the present invention.

As illustrated in FIG. 12, the non-inverting integrator includes a level crossing detector having two zero-crossing detectors, Zero Crossing Detector 1 (310) and Zero Crossing Detector 2 (320). As illustrated in FIG. 12, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

The thresholds of the Zero Crossing Detector 1 (310) and Zero Crossing Detector 2 (320) are selected to minimize overshoot. For example, the threshold for Zero Crossing Detector 1 (310) may be made negative by a slightly smaller amount than the expected overshoot in the first segment. This minimizes the ramp-down time in the second segment. Also, the threshold for Zero Crossing Detector 2 (320) may be made more positive by the amount of the overshoot in the second segment in order to cancel the effect of the overshoot. Alternatively, the threshold for Zero Crossing Detector 1 (310) may be made more negative than the expected overshoot during the first segment. This permits Zero Crossing Detector 2 (320) to be appositive ramp rather than a negative ramp.

In other words, Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 13:
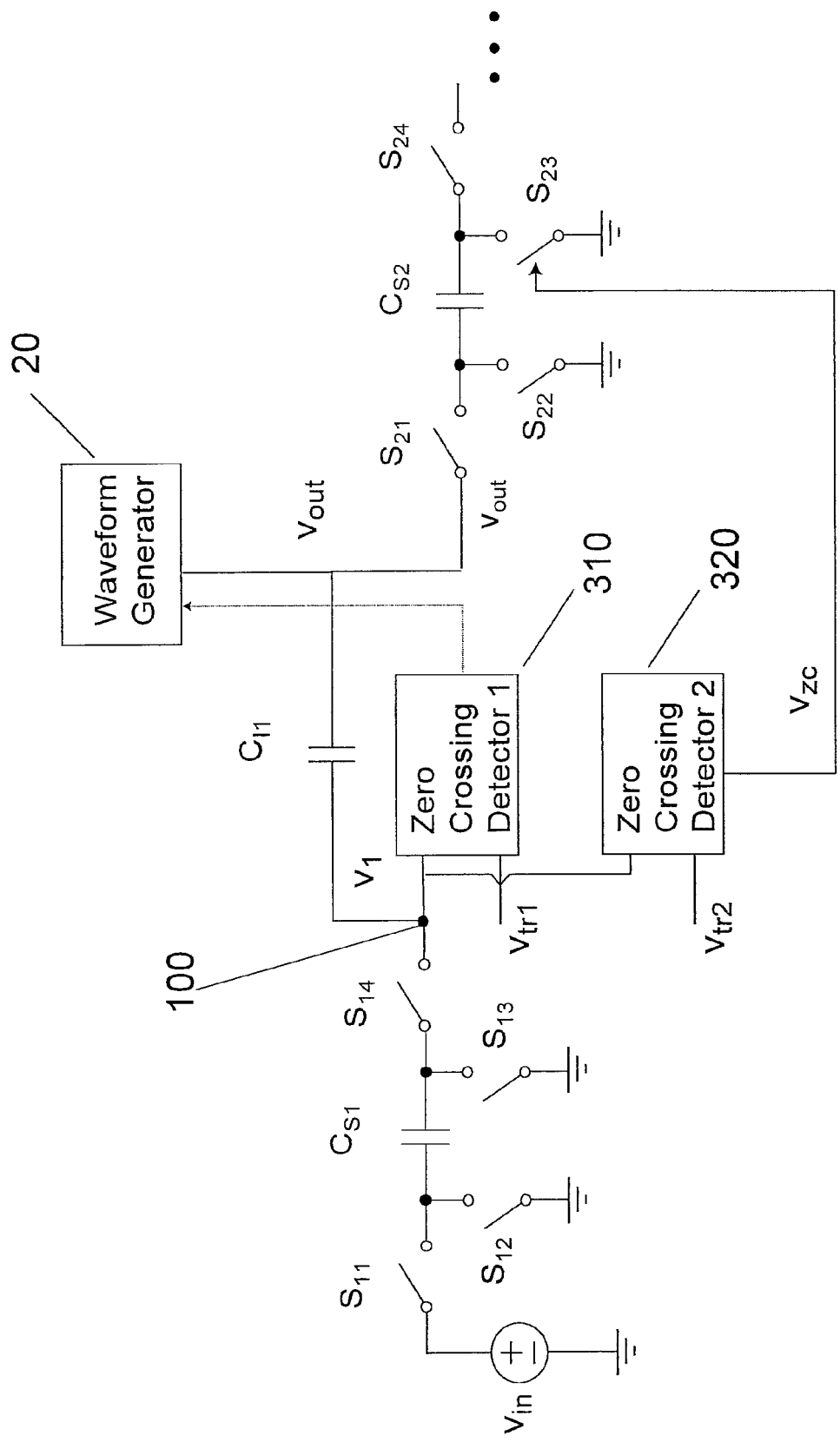
FIG. 13 illustrates another non-inverting integrator according to the concepts of the present invention.

As illustrated in FIG. 13, the non-inverting integrator includes a level crossing detector having two zero-crossing detectors, Zero Crossing Detector 1 (310) and Zero Crossing Detector 2 (320). As illustrated in FIG. 13, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

Both detectors, Zero Crossing Detector 1 (310) and Zero Crossing Detector 2 (320), have nominally zero thresholds. The detection thresholds are determined by voltages $V_{tr1}$ and $V_{tr2}$ applied to the inputs of Zero Crossing Detector 1 (310) and Zero Crossing Detector 2 (320), respectively. Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 14:
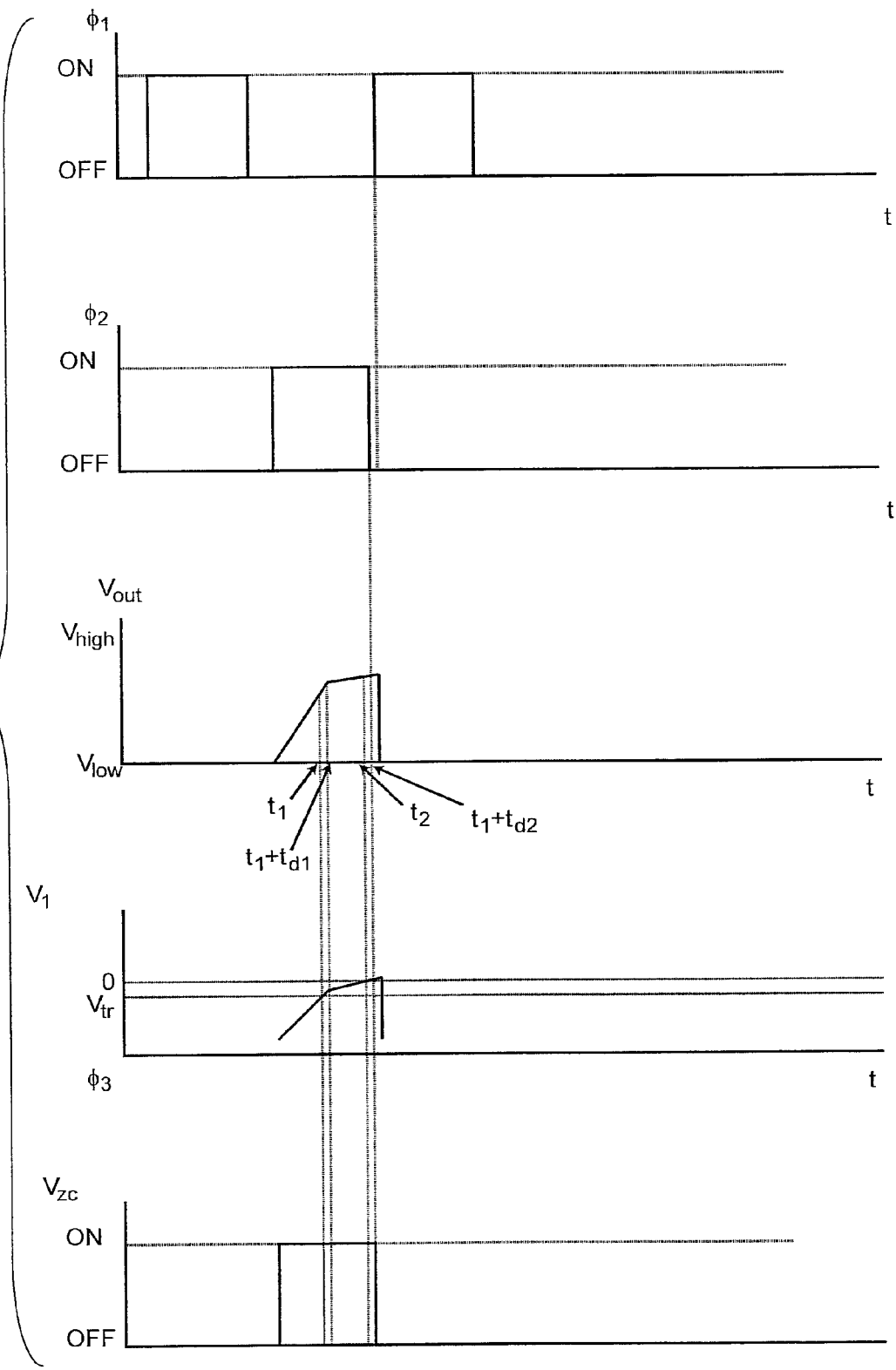
FIG. 14 illustrates a timing diagram for the non-inverting integrator of FIG. 13.

It is noted that the above-described embodiment may operate as a self-timed system. In this configuration, Rather than supplying constant frequency clock phases $\phi_1$ and $\phi_2$, the clock phases are derived from the outputs of Zero Crossing Detector 1 (310) and Zero Crossing Detector 2 (320). FIG. 14 illustrates a self-timed operation.

As illustrated in FIG. 14, the end of the phase $\phi_2$ is defined by the output of the detection during the last segment. The beginning of the clock phase $\phi_1$ is defined by a short delay, such as logic delays, after the end of $\phi_2$. The short delay is generally necessary to ensure non-overlapping clock phases. The end of the clock phase $\phi_1$ is determined by the zero crossing detection of the previous stage or the following stage in the similar manner.

It is noted that the various embodiments described above can be utilized in a pipeline analog-to-digital converter, an algorithmic analog-to-digital converter, a switched-capacitor amplifier, a delta-sigma modulator, or a self-timed algorithmic analog-to-digital converter. More specifically, zero crossing detectors can be applied in other switched-capacitor circuits such as algorithmic and pipeline analog-to-digital converters, delta-sigma converters, and amplifiers.

Figure 15:
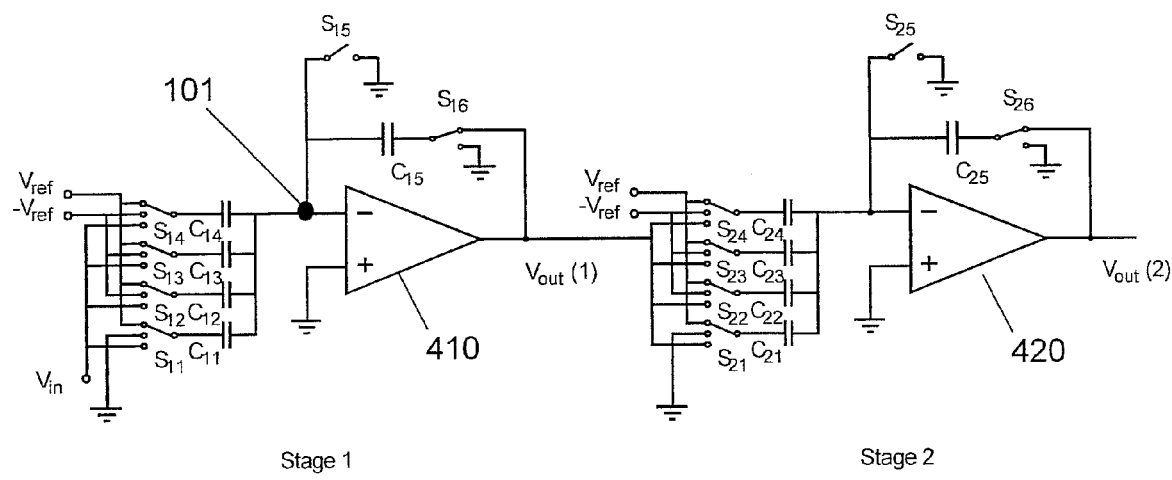
FIG. 15 illustrates a pipeline analog-to-digital converter.

These applications often require constant voltage sources, referred to as reference voltages. A pipeline analog-to-digital converter is shown in FIG. 15 in which the first two stages of the pipeline are shown. As in the switched-capacitor integrator in FIG. 2, the pipeline converter operates in two phases as in the switched-capacitor integrator in FIG. 2.

As illustrated in FIG. 15, first stage capacitors $C_{11}$-$C_{14}$ are connected to either ground, $V_{in}$, $V_{REF}$, or $-V_{REF}$ through switches $S_{11}$-$S_{14}$, respectively. It is noted that only first stage capacitor $C_{11}$ can be connected to ground. Each first stage capacitor ($C_{11}$-$C_{14}$) is connected to the inverted input of amplifier 410. The output $V_{out}(1)$ of amplifier 410 is feedback to the inverted input of amplifier 410 through switch $S_{16}$ and capacitor $C_{15}$. It is noted that the inverted input of amplifier 410 may also be connected to ground through switch $S_{15}$.

Moreover, as illustrated in FIG. 15, second stage capacitors $C_{21}$-$C_{24}$ are connected to either ground, $V_{out}(1)$, $V_{REF}$, or $-V_{REF}$ through switches $S_{21}$-$S_{24}$, respectively. It is noted that only second stage capacitor $C_{21}$ can be connected to ground. Each second stage capacitor ($C_{21}$-$C_{24}$) is connected to the inverted input of amplifier 420. The output $V_{out}(2)$ of amplifier 420 is feedback to the inverted input of amplifier 420 through switch $S_{26}$ and capacitor $C_{25}$. It is noted that the inverted input of amplifier 420 may also be connected to ground through switch $S_{25}$.

Figure 16:
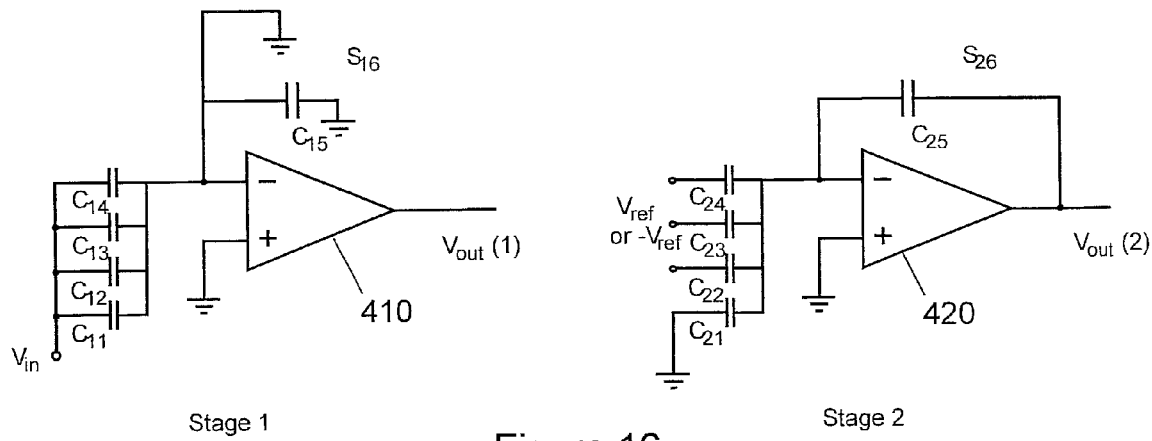
FIG. 16 illustrates a sampling phase of the pipeline analog-to-digital converter of FIG. 15.
Figure 17:
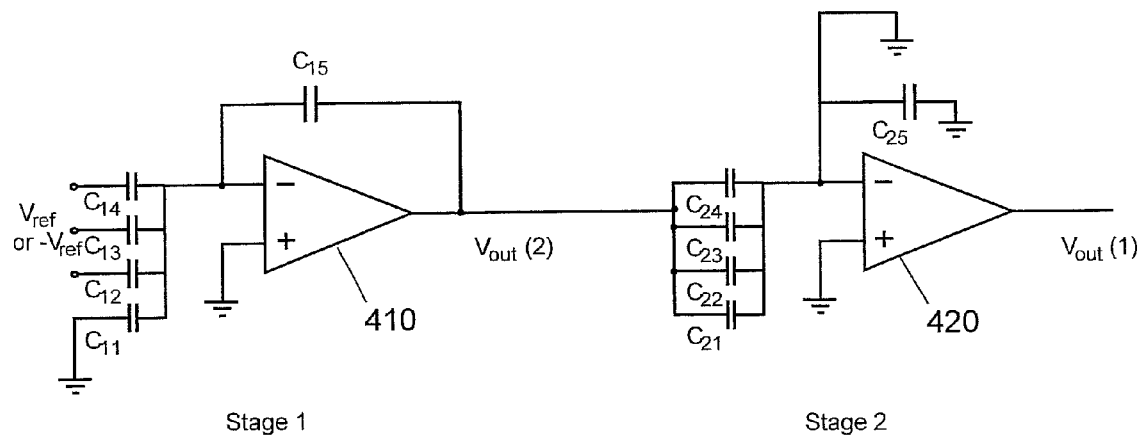
FIG. 17 illustrates a second phase of the pipeline analog-to-digital converter of FIG. 15.

During the first phase, the sampling phase, the input voltage is sampled on the first stage capacitors $C_{11}$-$C_{14}$, as shown in FIG. 16. During the sampling phase, the input voltage is compared with $-\frac{1}{2}V_{REF}$, 0, and $\frac{1}{2}V_{REF}$. In the second phase, the charge in $C_{11}$-$C_{14}$ is transferred to the feedback capacitor $C_{15}$ as shown in FIG. 17. Depending on the comparison results from the first phase, the first stage capacitors $C_{11}$-$C_{13}$ are connected to either $V_{REF}$ or $-V_{REF}$.

The output voltage of the first stage is also sampled by the second stage capacitors $C_{21}$-$C_{24}$ in the second phase, the transfer phase, of the first stage. Thus, the transfer phase of the first stage coincides with the sampling phase of the second stage. The operational amplifier 410 must force the voltage at Node 101 to virtual ground in order for the output voltage to be accurate. As in other sampled-data analog circuits, forcing of virtual ground by an operational amplifier is power intensive.

Figure 18:
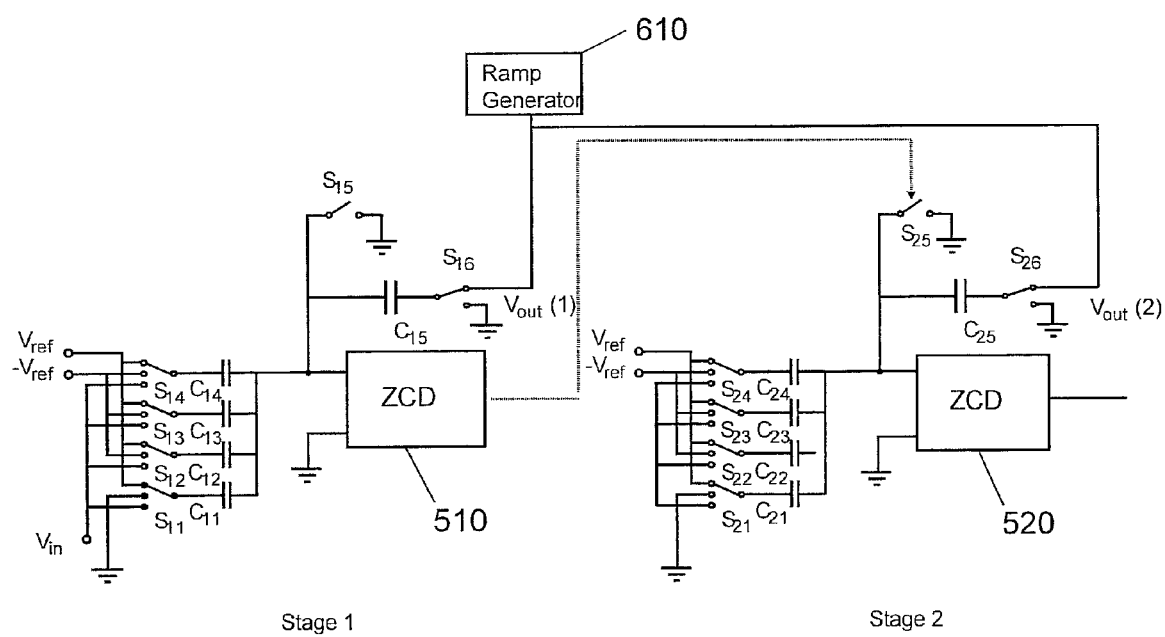
FIG. 18 illustrates a pipeline analog-to-digital converter based on a zero-crossing detector.

A pipeline converter based on zero-crossing detectors can be substantially more efficient in power consumption and area compared with conventional approaches based on operational amplifiers as illustrated in FIGS. 15-17. An embodiment of a pipeline converter based on zero crossing detection provided by the invention is shown in FIG. 18. Only the first two stages of pipeline are shown for clarity.

As illustrated in FIG. 18, first stage capacitors $C_{11}$-$C_{14}$ are connected to either ground, $V_{in}$, $V_{REF}$, or $-V_{REF}$ through switches $S_{11}$-$S_{14}$, respectively. It is noted that only first stage capacitor $C_{11}$ can be connected to ground. Each first stage capacitor ($C_{11}$-$C_{14}$) is connected to one input terminal of a zero crossing detector 510. The output $V_{out}(1)$ of the zero crossing detector 510 controls activation of switch $S_{25}$. A ramp generator 610 is connected to the one input terminal of the zero crossing detector 510 through switch $S_{16}$ and capacitor $C_{15}$. It is noted that the one input terminal of the zero crossing detector 510 may also be connected to ground through switch $S_{15}$. It is further noted that capacitor $C_{15}$ may also be connected to ground through switch $S_{16}$.

Moreover, as illustrated in FIG. 18, second stage capacitors $C_{21}$-$C_{24}$ are connected to either ground, $V_{REF}$, or $-V_{REF}$ through switches $S_{21}$-$S_{24}$, respectively. It is noted that only first stage capacitor $C_{21}$ can be connected to ground. Each second stage capacitor ($C_{21}$-$C_{24}$) is connected to one input terminal of a second zero crossing detector 520. The ramp generator 610 is connected to the one input terminal of the second zero crossing detector 520 through switch $S_{26}$ and capacitor $C_{25}$. It is noted that the one input terminal of the second zero crossing detector 520 may also be connected to ground through switch $S_{25}$. It is further noted that capacitor $C_{25}$ may also be connected to ground through switch $S_{26}$.

Figure 19:
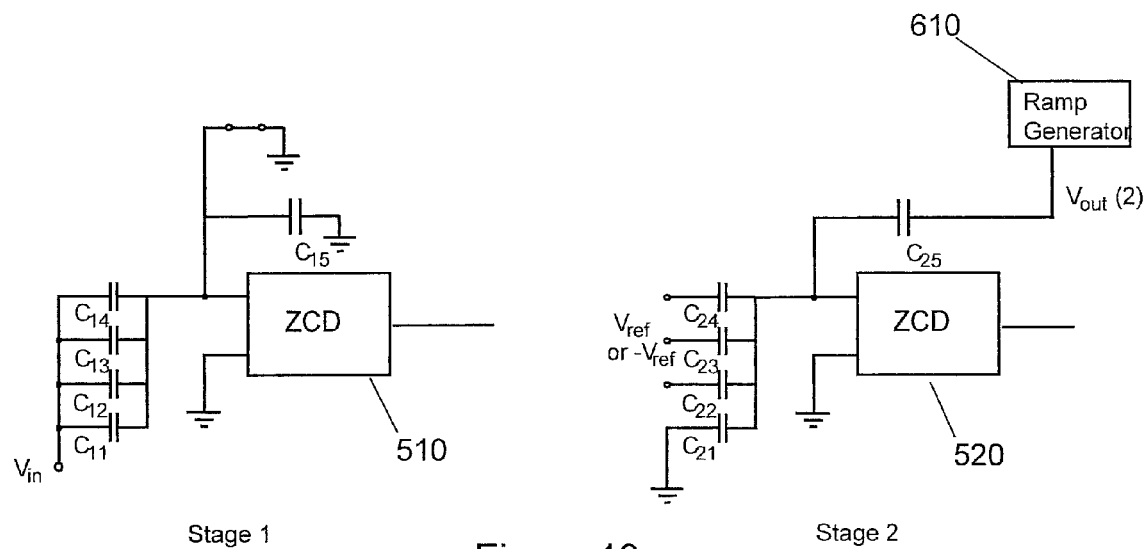
FIG. 19 illustrates a sampling phase of the pipeline analog-to-digital converter of FIG. 18.

As in the pipeline converter of FIGS. 15-17, the pipeline converter in FIG. 18 operates in two phases. The first phase is schematically shown in FIG. 19. For clarity of description, switches are omitted, and only the voltages applied through the omitted switches are indicated. The operation is performed in two phases. During the first phase, the sampling phase, the input voltage is sampled on the first stage capacitors $C_{11}$-$C_{14}$, as shown in FIG. 19. Also during the sampling phase, the input voltage is compared with $-\frac{1}{2}V_{REF}$, 0, and $\frac{1}{2}V_{REF}$.

Figure 20:
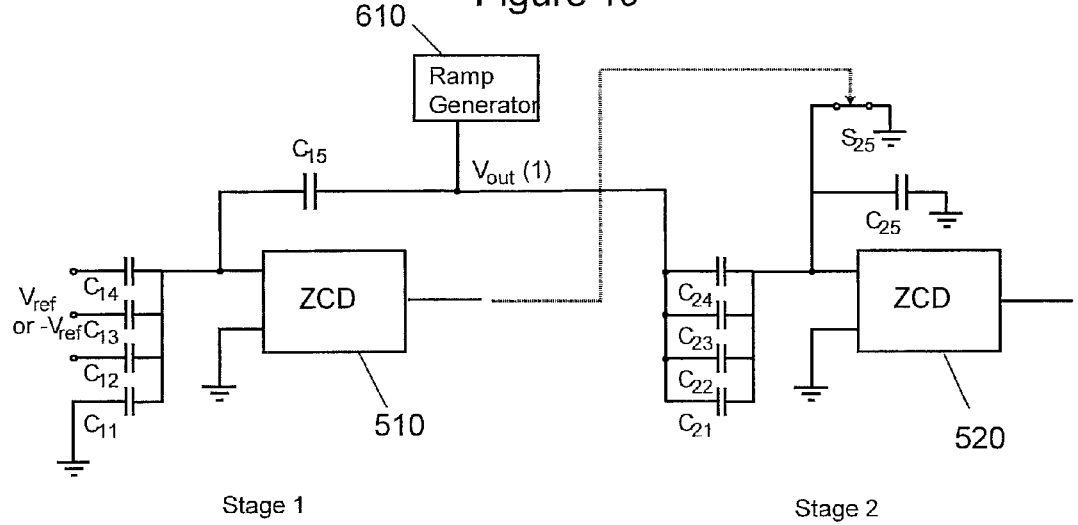
FIG. 20 illustrates a second phase of the pipeline analog-to-digital converter of FIG. 18.

In the second phase, the transfer phase, the charge in $C_{11}$-$C_{14}$ is transferred to the feedback capacitor $C_{15}$ as shown in FIG. 20. Depending on the comparison results from the first phase, the first stage capacitors $C_{11}$-$C_{13}$ are connected to either $V_{REF}$ or $-V_{REF}$.

The ramp waveform generator 610 sweeps the output voltage $V_{out}(1)$ up and then down, causing the input voltage of the zero crossing detector 510 to cross the ground potential or the common-mode voltage. The output status of the zero crossing detector 510 changes, and the sampling switch $S_{25}$ of second stage is turned OFF. This locks the accurate voltage on the second stage capacitors $C_{21}$-$C_{24}$ because the sampling switch is turned OFF at the time the input voltage of the zero crossing detector 510 is at or near the virtual ground.

Figure 21:
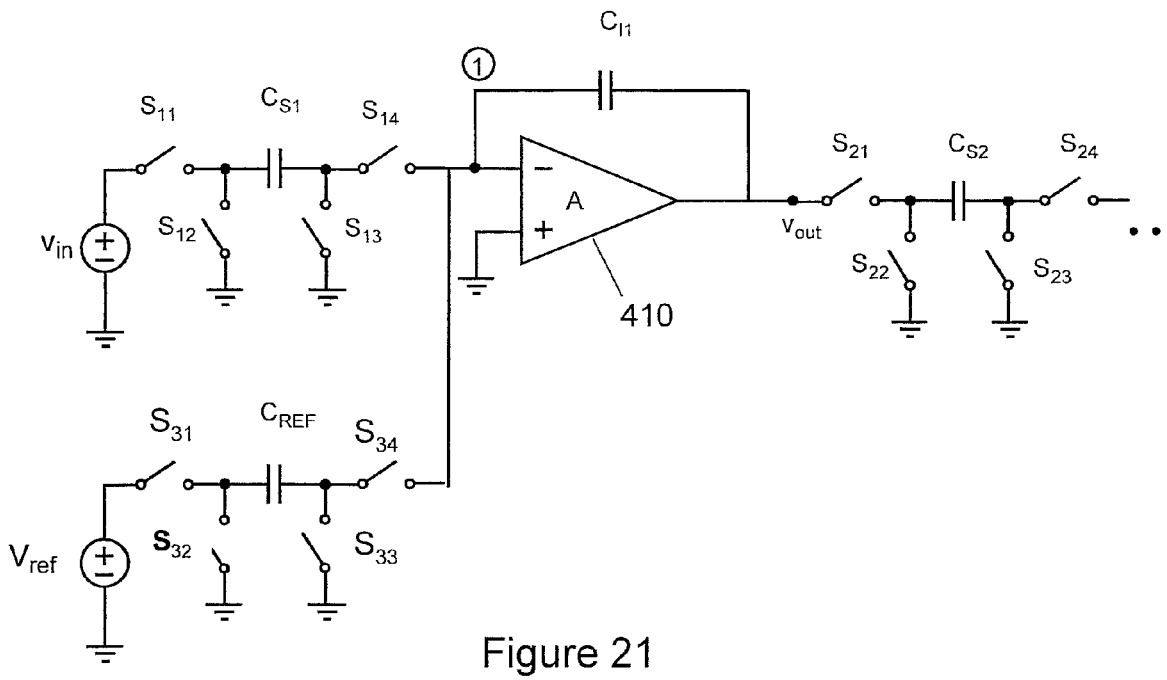
FIG. 21 illustrates a delta-sigma analog-to-digital converter.

In pipeline converters, the reference voltages are generally applied during the transfer phase as explained in the preceding description. Depending on the function implemented, however, the reference voltages may be applied during the sampling phase. For example, many delta-sigma converters may apply the reference voltages during the sampling phase. FIG. 21 illustrates an example of a delta-sigma converter.

As illustrated in FIG. 21, a capacitor $C_{S1}$ is charged by voltage source $V_{in}$ through the operations of switches $S_{11}$-$S_{14}$. Also, a capacitor $C_{REF}$ is charged by voltage source $V_{ref}$ through the operations of switches $S_{31}$-$S_{34}$.

In the delta-sigma converter, as shown in FIG. 21, the input voltage $V_{in}$ is sampled by capacitor $C_{S1}$ during the sampling phase. The reference voltage $V_{REF}$ is sampled by capacitor $C_{ref}$ during the same phase. The charge in both capacitors $C_{S1}$ and $C_{ref}$ is transferred to capacitor $C_{f1}$ during the transfer phase.

Figure 22:
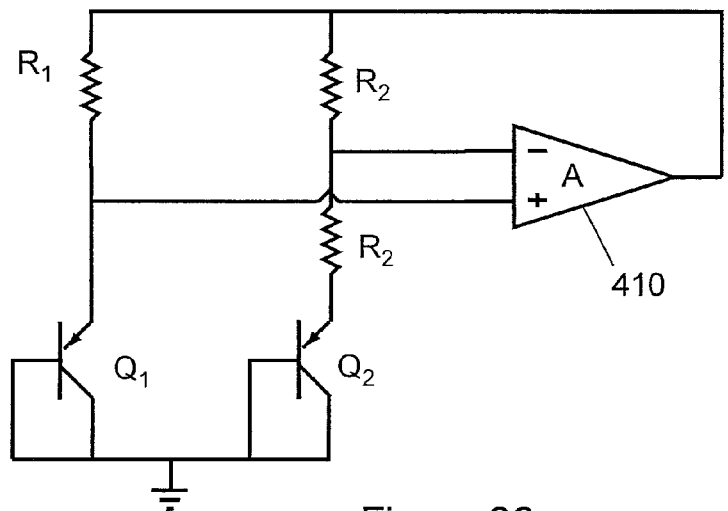
FIG. 22 illustrates a bandgap reference circuit.

The reference voltages $V_{REF}$ and $-V_{REF}$ can be generated from bandgap reference circuits and are driven by operational amplifiers. An example bandgap reference circuit is shown in FIG. 22. A first bias voltage, the base-emitter voltage of $Q_1$, is applied to the input of an operational amplifier 410. A second bias voltage, the base-emitter voltage of $Q_2$, is also applied to a non-inverting input of the amplifier 410 through a resistor $R_2$. It is noted that the output voltage of the amplifier 410 is closely related to the bandgap voltage, which is substantially independent of operating temperature.

Unless large bypass capacitors are used on the reference voltages, it is generally required that the reference voltage settle to an accurate value within the half clock period. In addition, the reference voltages must present low noise, preferably lower than ½ LSB at the intended resolution of the A/D converter.

In order to provide fast settling and low noise, the power consumed in the reference voltage circuits can be a substantial portion of overall power consumption A/D converters. In applications other than A/D converters, voltage sources similar to reference voltage sources may be applied for level shifting or other purposes. If similar op-amp based voltage source circuits are employed in zero-crossing detector based circuits, the power consumption of the reference circuit may be overwhelming because the zero-crossing detector based circuits consume little power.

The invention provides configurations for applying voltage sources, such as reference voltages, in zero-crossing detector based circuits in a manner that reduces the power consumption required in such voltage sources without degrading noise performance or speed of zero-crossing based circuits.

Figure 23:
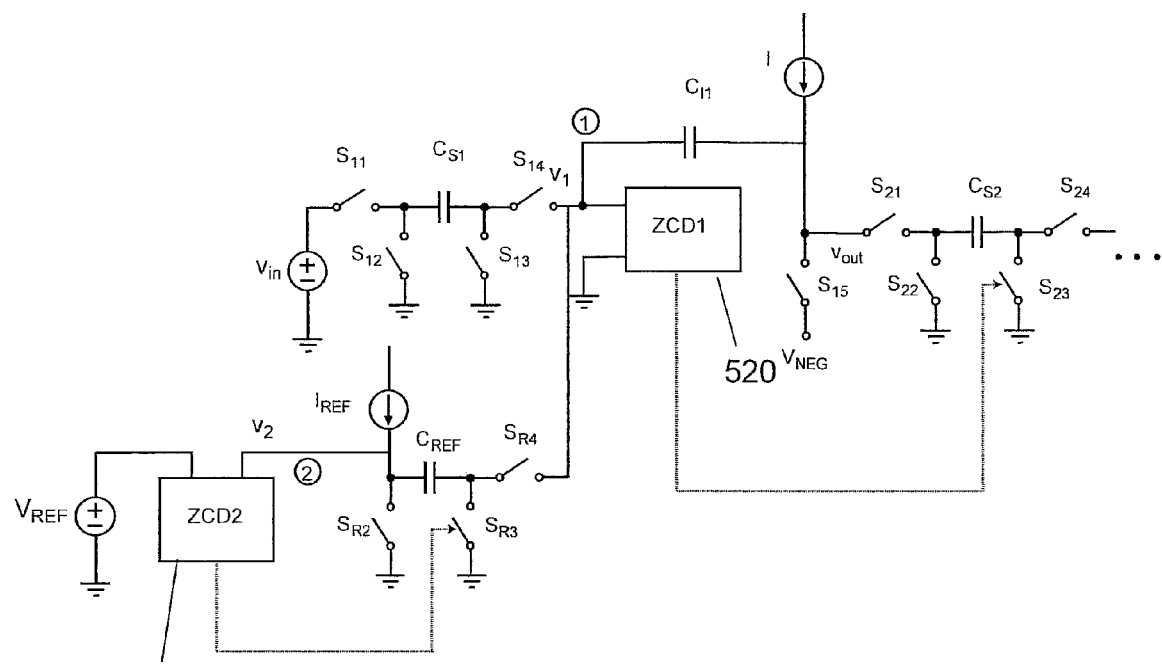
FIG. 23 illustrates a delta-sigma analog-to-digital converter based on a zero-crossing detector.

An example of a first stage integrator of a zero-crossing detector based delta-sigma converter is illustrated in FIG. 23. In this embodiment, the reference voltage is sampled during the sampling phase of switched-capacitor circuits.

As illustrated in FIG. 23, a first zero-crossing detector ZCD1 controls the sampling instant of the next stage integrator. A first waveform generator is shown as a variable current source I charging capacitor $C_{I1}$. A second zero-crossing detector ZCD2 controls the sampling of the reference voltage on sampling capacitor $C_{REF}$. During the sampling phase of the first integrator stage, the input voltage $V_{in}$ is sampled by capacitor $C_{S1}$ by turning switches $S_{11}$ and $S_{13}$ ON, as described with respect to the integrator stage of FIG. 21.

A second waveform generator, shown as a variable current source $I_{REF}$ charging capacitor $C_{REF}$, produces a waveform, for example the two-segment ramp Illustrated in FIG. 7. The output voltage $V_2$ is compared with the reference voltage $V_{REF}$ by second zero-crossing detector ZCD2. The first time $V_2$ crosses $V_{REF}$, the second waveform generator advances its output to the next segment by changing the current $I_{REF}$. The second segment is preferably a ramp with a slower rate of change than the first segment.

When $V_2$ crosses $V_{REF}$ again during the second segment, second zero-crossing detector ZCD2 turns $S_{R3}$ OFF. The voltage sampled on capacitor $C_{REF}$ is equal to $V_{REF}$ except a small amount of error caused by the undershoot due to the finite delay of second zero-crossing detector ZCD2.

During the transfer phase, both the input voltage $V_{in}$ sampled on capacitor $C_{S1}$ and the reference voltage $V_{REF}$ is sampled on capacitor $C_{REF}$ are transferred to the integrating capacitor $C_{I1}$. Switches $S_{12}$, $S_{14}$, $S_{R2}$, $S_{R4}$, $S_{21}$, and $S_{23}$ are closed. Switch $S_{15}$ is briefly turned ON to precharge $V_{out}$. The output voltage $V_{out}$ begins to rise when switch $S_{15}$ is turned OFF. At the time the voltage $V_1$ at Node 1 crosses zero during the last segment of the ramp generator, first zero-crossing detector ZCD1 turns switch S23 OFF, then turns switch $S_{21}$ OFF. Transferring the charge from capacitor $Cs_1$ and capacitor $C_{REF1}$ to capacitor $C_{I1}$ and sampling of the output voltage to capacitor $C_{S2}$ is complete at this point.

Figure 24:
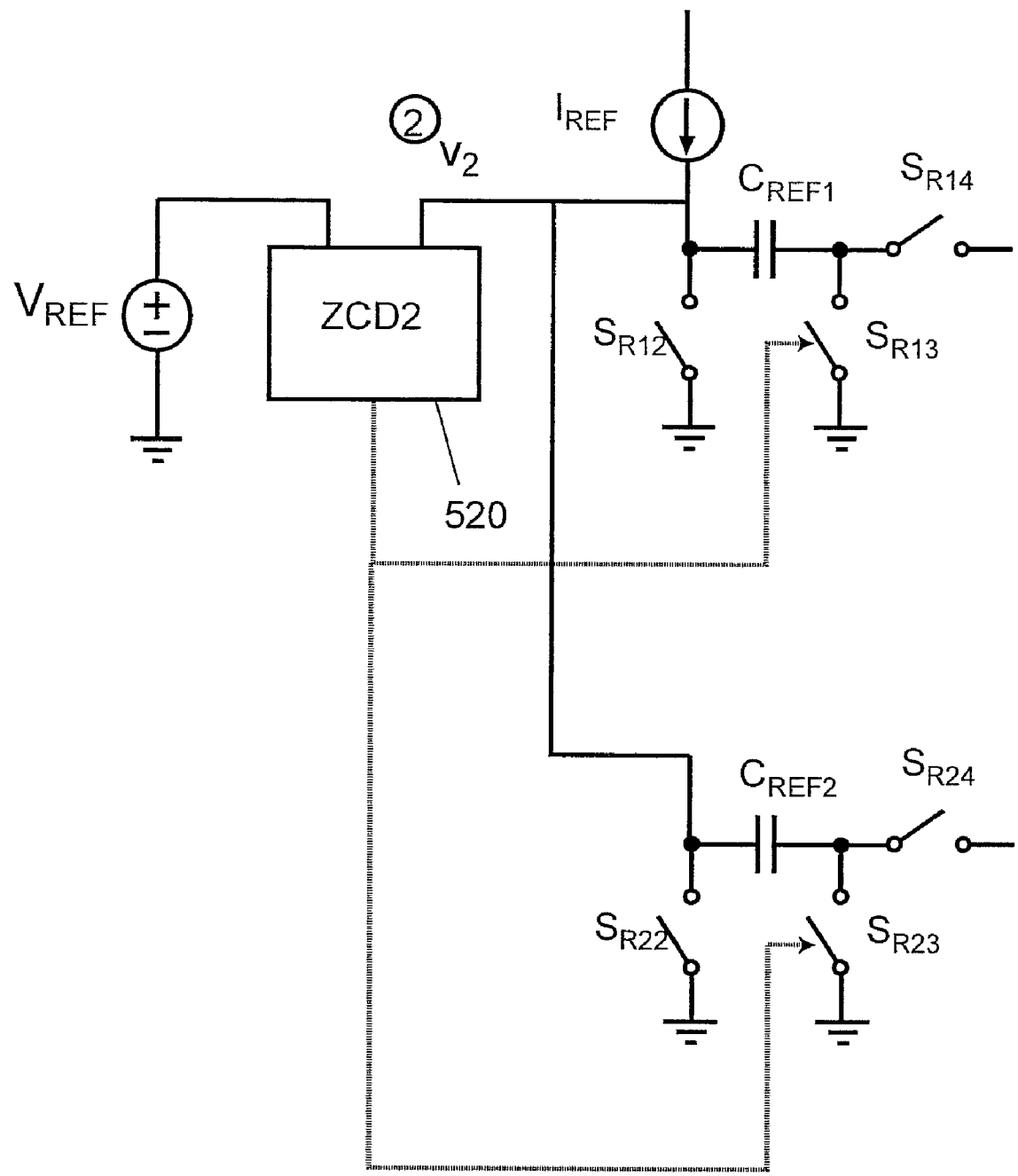
FIG. 24 illustrates another delta-sigma analog-to-digital converter based on a zero-crossing detector.

Although only one capacitor, $C_{REF}$, is shown to sample the reference voltage, $V_{REF}$, in FIG. 23, multiple capacitors can sample the same reference voltage. For example, in the circuit of FIG. 24, capacitors $C_{REF1}$ and $C_{REF2}$ sample the reference voltage. Second zero-crossing detector ZCD2 turns switches $S_{R13}$ and $S_{R23}$ OFF to sample the reference voltage in the same manner as in the circuit of FIG. 23.

If the bandwidth of the reference voltage source is greater than the effective bandwidth of second zero-crossing detector ZCD2 in FIG. 23, the noise in $V_{REF}$ is reduced by the lower bandwidth of second zero-crossing detector ZCD2. This would be the case if no bypass capacitor is connected across $V_{REF}$. Such omission of bypass capacitors is highly desirable because it saves die area or extra pins for external bypass capacitors.

Since $V_{REF}$ only sees the input capacitance of second zero-crossing detector ZCD2, the design of the reference voltage source is greatly simplified. In the reference sampling circuits described above, the reference source must drive the reference sampling capacitor directly. Therefore, the reference source typically uses an operational amplifier.

It is noted that the operational amplifiers can be omitted because the loading on the reference voltage source is very small. In addition, due to the filtering property of second zero-crossing detector ZCD2, the reference voltage source is allowed to have much higher noise spectral density compared with prior art reference sampling circuit. The small load and higher noise spectral density save substantial power from the reference circuit.

Figure 25:
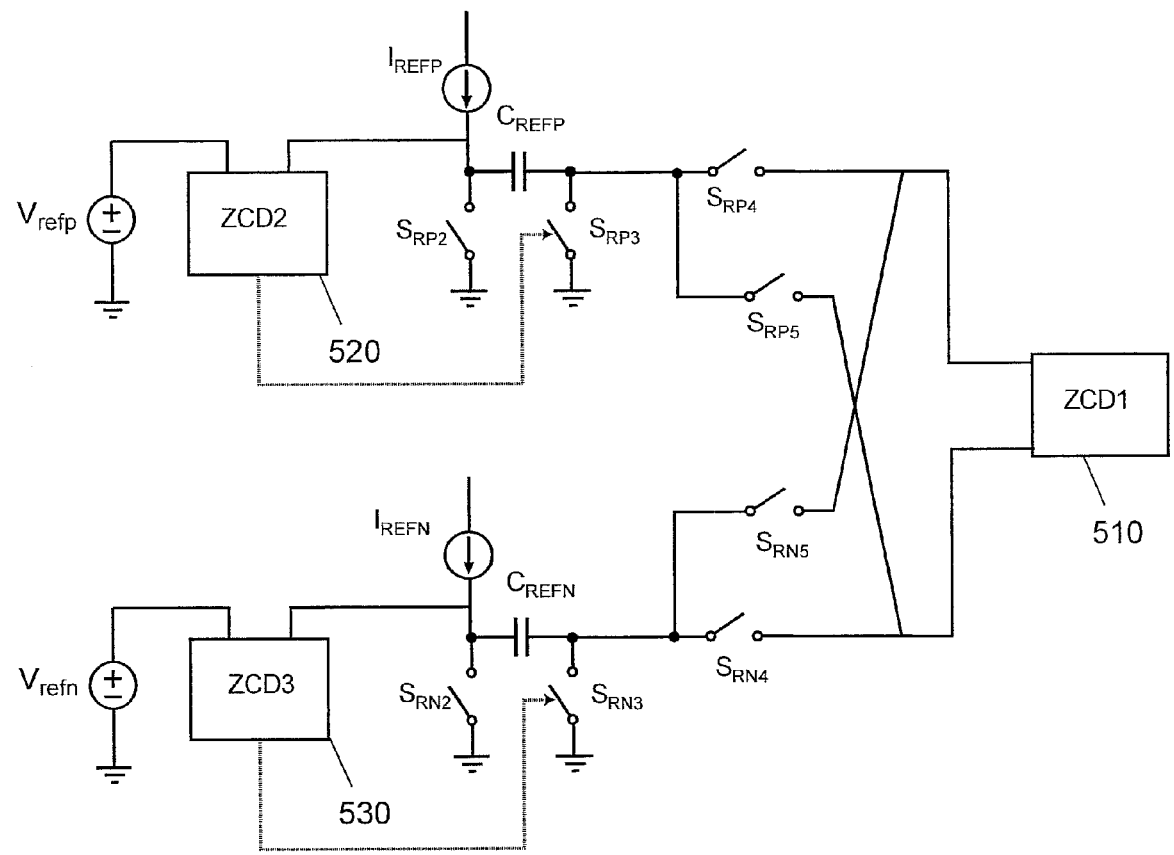
FIG. 25 illustrates a fully-differential analog-to-digital converter based on zero-crossing detectors.

Frequently, switched-capacitor circuits are implemented in a fully-differential configuration. The various embodiments described above can be implemented in fully-differential configuration. As an example, a fully-differential version of the first embodiment is shown in FIG. 25, where only the reference sampling circuit is shown for clarity.

The input voltages are applied differentially (not shown). Two reference voltages $V_{REFP}$ and $V_{REFN}$ are sampled on capacitors $C_{REFP}$ and $C_{REFN}$, respectively, during the sampling phase. The zero-crossing detectors ZCD2 and ZCD3 control the sampling of $V_{REFP}$ and $V_{REFN}$ by controlling the state of switches $S_{RP3}$ and $S_{RN3}$. During the transfer phase, switches $S_{RP2}$ and $S_{RN2}$ are closed.

If reference subtraction is desired, switches $S_{RP5}$ and $S_{RN5}$ are closed. If reference addition is desired, on the other hand, switches $S_{RP4}$ and $S_{RN4}$ are closed instead. The first zero-crossing detector ZCD1 controls the operation of the first stage integrator and the sampling of its result by the second stage sampling capacitors, as in the first embodiment.

Figure 26:
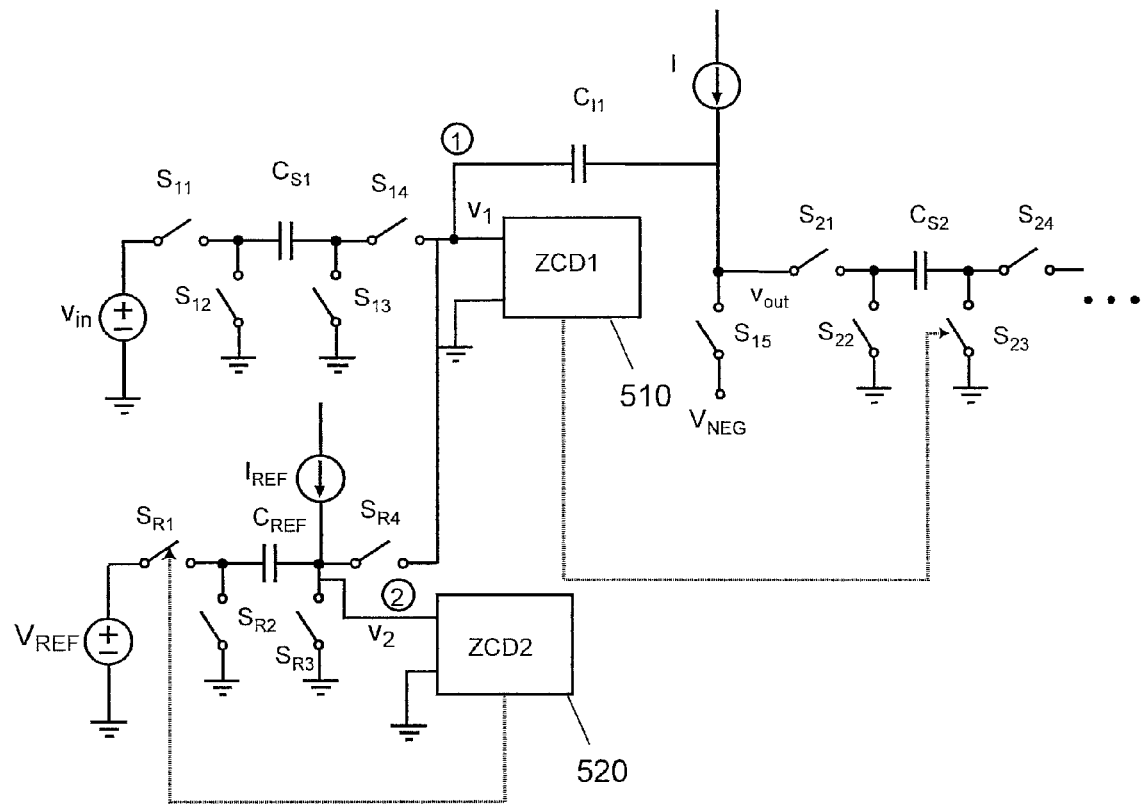
FIG. 26 illustrates an analog-to-digital converter based on zero-crossing detectors.

A further embodiment of this configuration is shown in FIG. 26. In this embodiment, voltage $V_{in}$ is sampled on $C_{S1}$ during the sampling phase. Voltage $V_{REF}$ is sampled on capacitor $C_{REF}$ during the sampling phase also, as follows. First, switches $S_{R1}$ and $S_{R3}$ are closed for a short period of time to sample the approximate value of voltage $V_{REF}$, preferably slightly lower than voltage $V_{REF}$ on capacitor $C_{REF}$. Since only the approximate value needs to be sampled, the voltage on capacitor $C_{REF}$ does not need to settle to an accurate value. Next, switch $S_{R3}$ is turned OFF. Using a negative value for $I_{REF}$, the voltage $V_2$ at Node 2 is ramped down. When voltage $V_2$ crosses zero, second zero-crossing detector ZCD2 turns switch $S_{R1}$ OFF. The voltage sampled on capacitor $C_{REF}$ is shown to be voltage $V_{REF}$ plus a small undershoot due to the finite delay of first zero-crossing detector ZCD1.

Figure 27:
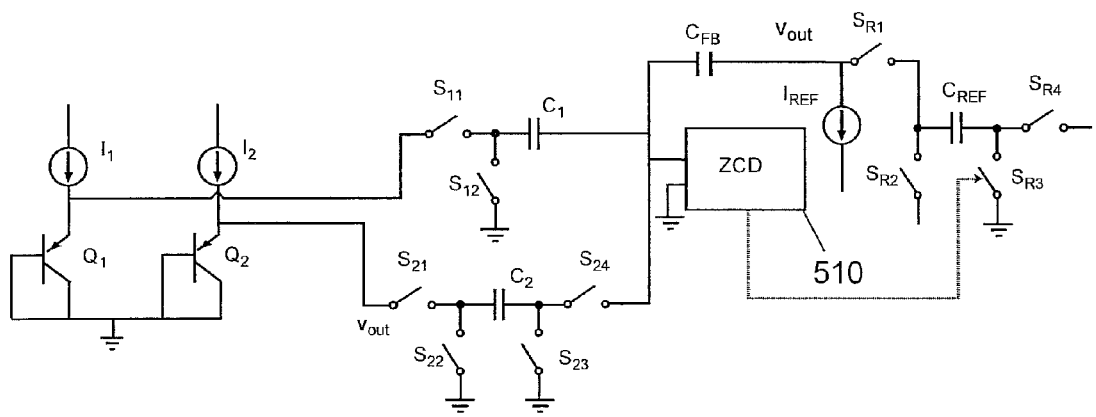
FIG. 27 illustrates an analog-to-digital converter which provides a bandgap based discrete-time reference voltage.

A further embodiment is shown in FIG. 27, which provides a bandgap based discrete-time reference voltage. First, the first bias voltage, the base-emitter voltage of transistor $Q_2$, is sampled on capacitor $C_2$ by turning switches $S_{21}$ and $S_{23}$ ON with switch $S_{12}$ ON. Next, the charge is transferred to the feedback capacitor $C_{FB}$ and the second bias voltage, the base-emitter voltage of transistor $Q_1$, is applied by turning switches $S_{11}$, $S_{21}$, and $S_{24}$ ON. The output voltage sampled by capacitor $C_{REF}$ when the zero crossing is detected by zero-crossing detector ZCD. The current $I_{REF}$ is changed in the similar manner as in zero-crossing detector ZCD based sampled-data circuits. The output voltage $V_{out}$ at the instant of zero crossing is shown to be $K_2V_{BE2}-K_1V_{BE1}$ where $K_1=C_1/C_{REF}$ and $K_2=C_2/C_{REF}$. With appropriate selection of capacitors $C_1$, $C_2$, and $C_{REF}$, voltage $V_{out}$ is shown to be a constant multiple of bandgap referenced voltage.

Figure 28:
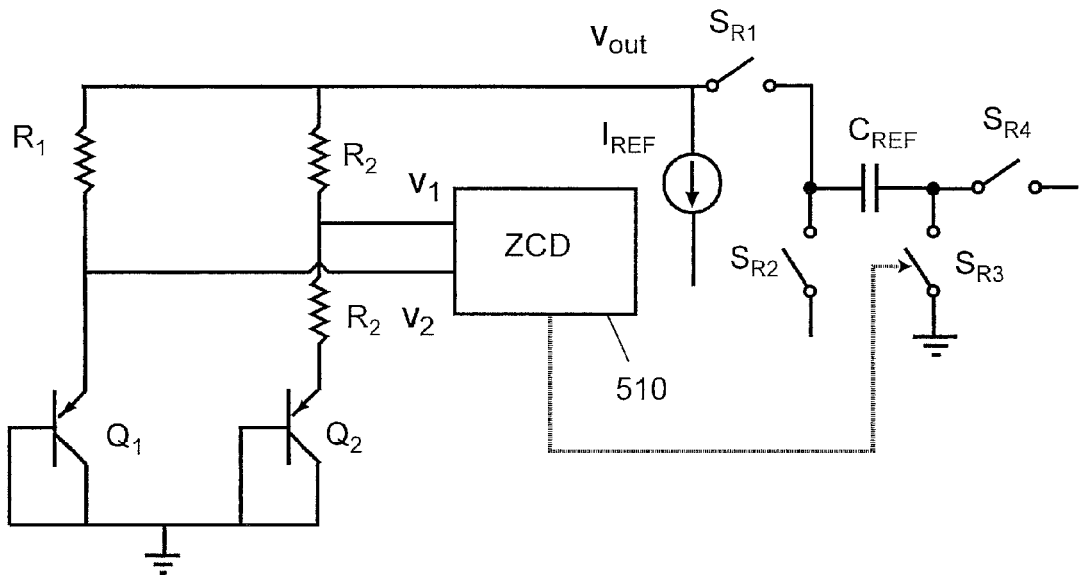
FIG. 28 illustrates an analog-to-digital converter based on a bandgap reference voltage source.

A further embodiment is shown in FIG. 28. This circuit is based on the bandgap reference voltage source in FIG. 22. In this embodiment, instead of forcing voltages $V_1$ and $V_2$ to be equal using an operational amplifier, the instant voltage $V_1$ crosses voltage $V_2$ is detected by zero-crossing detector ZCD in a similar manner as in zero-crossing detector ZCD based sampled-data circuits.

The current $I_{REF}$ is changed in the similar manner, for example to produce multiple segments of a ramp waveform, as in zero-crossing detector ZCD based sampled-data circuits. The output voltage $V_{out}$ at the time voltage $V_1$ crosses voltage $V_2$ is very close to the bandgap reference voltage source in FIG. 22. The zero-crossing detector ZCD turns the sampling switch $S_{R3}$ OFF locking an accurate voltage on capacitor $C_{REF}$.

In circuits where the reference voltage is applied during the transfer phase, the reference voltage source must provide an accurate voltage at the instant the sampling switch of the next stage is turned OFF. This generally requires the reference voltage source to be an amplifier-driven source such as the one shown in FIG. 22. When a bandgap reference source is employed in a zero-crossing detector ZCD based sampled-data circuit, the reference source must settle fast, requiring wide bandwidth. But in the embodiment of FIG. 28, the amplifier in the reference source may be designed differently because the noise bandwidth is not determined by the reference source but by the zero-crossing detector ZCD.

Figure 29:
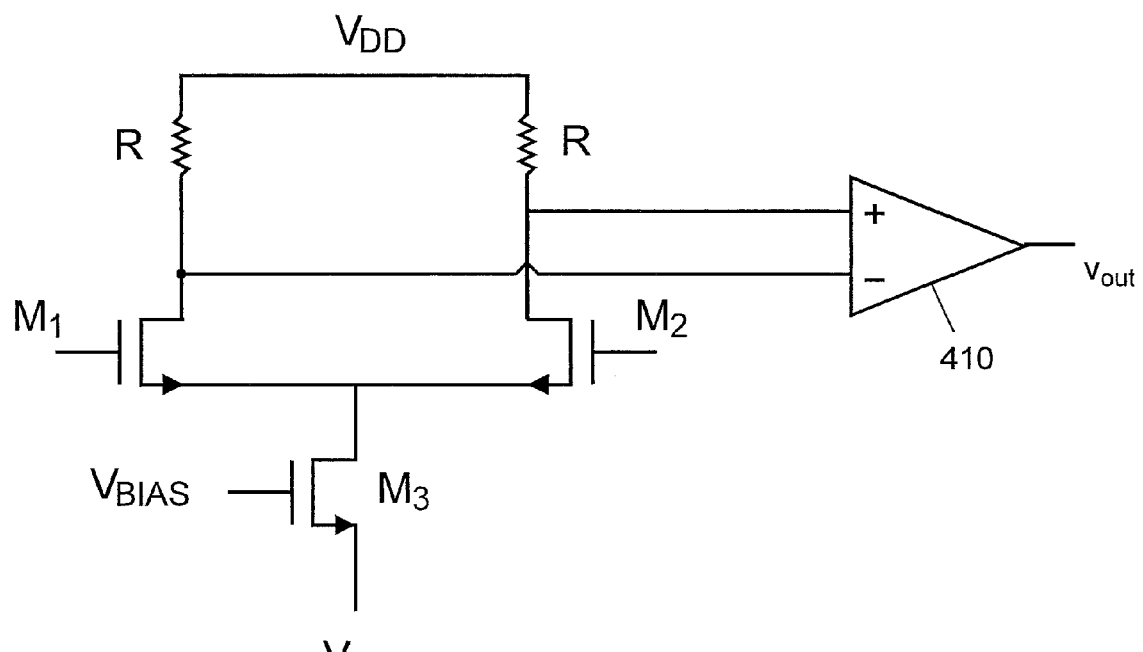
FIG. 29 illustrates an operational amplifier preceded by a low-to-moderate gain preamplifier for a zero-crossing detector sampled-data circuit.

As illustrated in FIG. 29, an operational amplifier 410 is preceded by a low-to-moderate gain preamplifier ($M_1$, $M_2$, $M_3$, and R). In this configuration, the operational amplifier 410 increases bandwidth without significant increase in power consumption.

Figure 30:
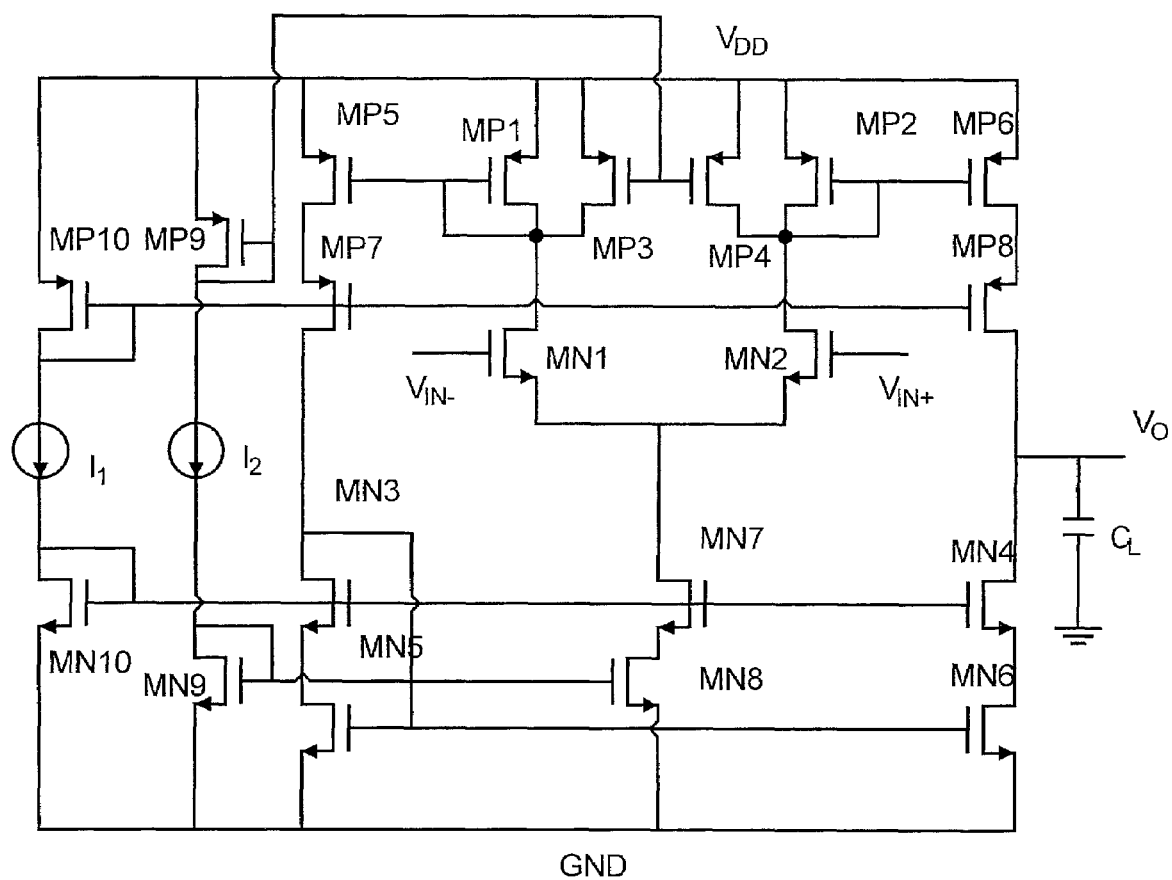
FIG. 30 illustrates an operational transconductance amplifier for a zero-crossing detector sampled-data circuit.

As illustrated in FIG. 30, an operational transconductance amplifier with gain in the current mirror is employed.

Figure 31:
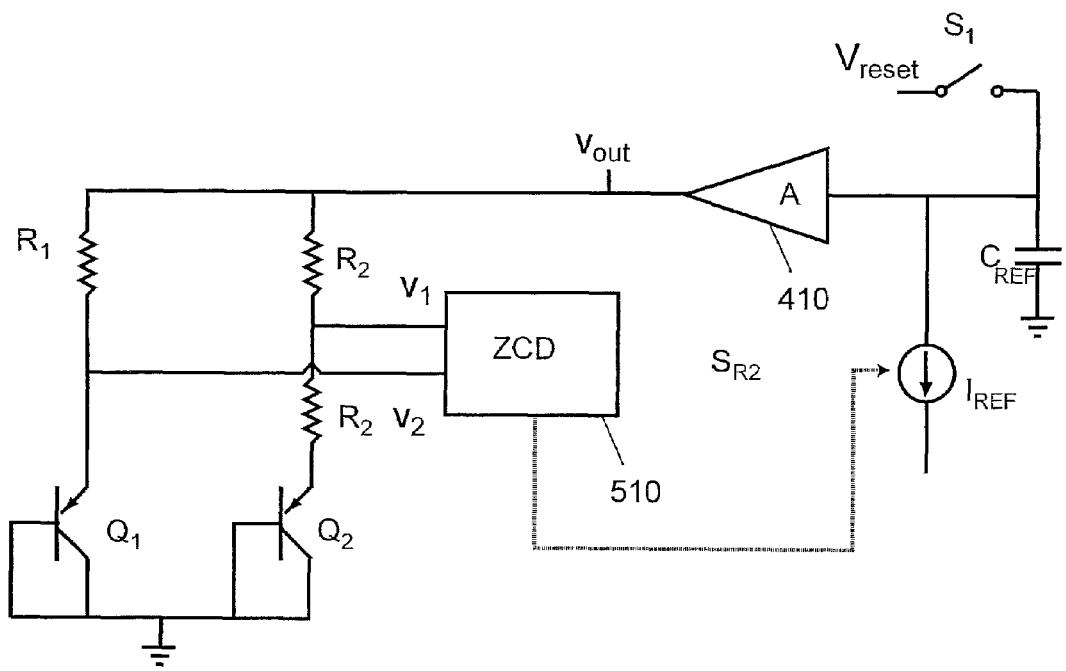
FIG. 31 illustrates another zero-crossing detector sampled-data circuit.

FIG. 31 shows another embodiment of the present invention based upon the bandgap reference circuit in FIG. 22, but the function of the operational amplifier 410 is replaced by a zero-crossing detector ZCD. A ramp generator consisting of a current source $I_{REF}$ and a capacitor $C_{REF}$ is connected to the zero-crossing detector ZCD. In this embodiment, instead of forcing voltage $V_1$ and voltage $V_2$ to be equal using an operational amplifier, the instant voltage $V_1$ crosses voltage $V_2$ is detected by zero-crossing detector ZCD in a similar manner as in zero-crossing detector ZCD based sampled-data circuits.

The current $I_{REF}$ is changed in the similar manner as in zero-crossing detector ZCD based sampled-data circuits. The output voltage, $V_{out}$, at the time voltage $V_1$ crosses voltage $V_2$, is the same as in the bandgap reference voltage source of FIG. 22. The zero-crossing detector ZCD turns the current source $I_{REF}$ OFF. The voltage on the capacitor $C_{REF}$ that produces the desired output voltage $V_{out}$ is held across the capacitor $C_{REF}$, such that an accurate output voltage is available for an extended period of time. The amplifier 410 can be, for example, a simple source-follower circuit.

Figure 32:
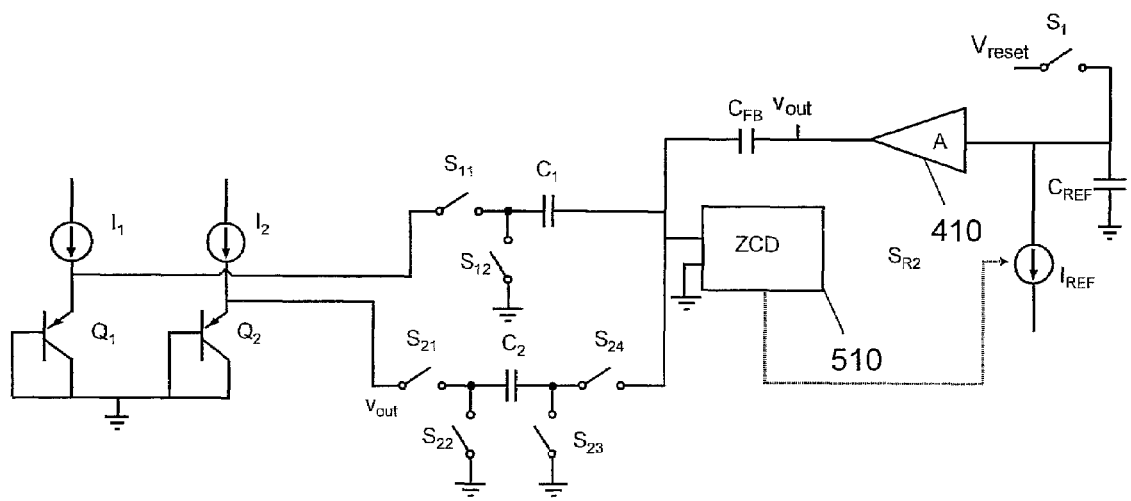
FIG. 32 illustrates another zero-crossing detector sampled-data circuit.

Another embodiment according to the present invention is shown in FIG. 32. This embodiment is based on the discrete-time bandgap reference circuit of FIG. 27, but further includes the output holding capability of the circuit in FIG. 31. First, the base-emitter voltage of transistor $Q_2$ is sampled on capacitor $C_2$ by turning switches $S_{21}$ and $S_{23}$ ON with switch $S_{12}$ ON.

Next, the charge is transferred to the feedback capacitor $C_{FB}$, by turning switches $S_{11}$, $S_{21}$, and $S_{24}$ ON. The zero crossing is detected by zero-crossing detector ZCD. The current $I_{REF}$ is changed in the similar manner as in zero-crossing detector ZCD based sampled-data circuits.

The output voltage $V_{out}$ at the instant of zero crossing is shown to be $K_2 V_{BE2} - K_1 V_{BE1}$ where $K_1 = C_1/C_{FB}$ and $K_2 = C_2/C_{REF}$. With appropriate selection of capacitors $C_1$, $C_2$, and $C_{FB}$, voltage $V_{out}$ is shown to be a constant multiple of a bandgap referenced voltage. The voltage that is required to produce the desired output voltage $V_{out}$ is held across the capacitor $C_{REF}$, such that an accurate output voltage is available for an extended period of time. The amplifier 410 can be, for example, a simple source-follower circuit.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. An analog-to-digital converter, comprising:
    a level-crossing detector to generate a level-crossing detection signal when an input signal crosses a predetermined level;
    a waveform generator to generate a predetermined waveform;
    a switched capacitance circuit;
    a sampling switch, operatively coupled to said level-crossing detector; and
    a voltage reference circuit operatively coupled to said switched capacitance circuit to provide a voltage reference level;
    said sampling switch turning OFF when said level-crossing detection signal indicates said input signal crossed said predetermined level.

2. The analog-to-digital converter as claimed in claim 1, wherein said voltage reference means includes an operational amplifier.

3. The analog-to-digital converter as claimed in claim 2, wherein said operational amplifier includes a pre-amplifier.

4. The analog-to-digital converter as claimed in claim 2, wherein said operational amplifier includes a current mirror with gain.

5. The analog-to-digital converter as claimed in claim 1, further comprising:
    a second level-crossing detector to generate a second level-crossing detection signal when a second input signal crosses a second predetermined level;
    a second sampling switch, operatively coupled to said second level-crossing detector; and
    a second switched capacitance circuit, operatively connected to said first sampling switch;
    said second sampling switch turning OFF when said second level-crossing detection signal indicates said second input signal crossed said second predetermined level.

6. The analog-to-digital converter as claimed in claim 1, wherein said level-crossing detector is a zero-crossing detector.

7. The analog-to-digital converter as claimed in claim 1, wherein said level-crossing detector is a comparator.

8. The analog-to-digital converter as claimed in claim 1, wherein said waveform generator produces a plurality of predetermined waveforms.

9. A reference voltage source, comprising:
    a level-crossing detector to generate a level-crossing detection signal when an input signal crosses a predetermined level;
    a waveform generator to generate a first predetermined waveform;
    a switch operatively coupled to said level-crossing detector;
    a sampling capacitor operatively connected to said level-crossing detector;
    a first bias voltage source operatively connected to an input terminal of the level-crossing detector; and
    a second bias voltage source operatively connected to said input terminal of the level-crossing detector;
    said switch turning OFF when said level-crossing detection signal indicates said input signal crossed said predetermined level.

10. The reference voltage source as claimed in claim 9, wherein said level-crossing detector is a comparator.

11. The reference voltage source as claimed in claim 9, wherein said level-crossing detector is a zero-crossing detector.

12. The reference voltage source as claimed in claim 9, wherein said waveform generator is a variable current source.

13. A reference voltage source, comprising:
a waveform generator to generate a predetermined waveform;
a first transistor operatively connected to said waveform generator;
a second transistor operatively connected to said waveform generator;
a level-crossing detector to generate a level-crossing detection signal when an input signal crosses a predetermined level;
a switch operatively coupled to said level-crossing detector; and
a sampling capacitor operatively connected to said level-crossing detector;
said first switch turning OFF when said level-crossing detection signal indicates said input signal crossed said predetermined level.

14. The reference voltage source as claimed in claim 13, wherein said level-crossing detector is a comparator.

15. The reference voltage source as claimed in claim 13, wherein said level-crossing detector is a zero-crossing detector.

16. The reference voltage source as claimed in claim 13, wherein said waveform generator is a variable current source.

17. A reference voltage source, comprising:
a waveform generator to generate a predetermined waveform;
an amplifier operatively connected to said waveform generator;
a first bias voltage source operatively connected to said amplifier;
a second bias voltage source operatively connected to said amplifier; and
a level-crossing detector to generate a level-crossing detection signal when an input signal crosses a predetermined level;
said waveform generator turning OFF when said level-crossing detection signal indicates said input voltage crossed said predetermined level.

18. The reference voltage source as claimed in claim 17, wherein said level-crossing detector is a comparator.

19. The reference voltage source as claimed in claim 17, wherein said level-crossing detector is a zero-crossing detector.

20. The reference voltage source as claimed in claim 17 wherein said waveform generator is a variable current source.

* * * * *